United States Patent [19]

Imazu et al.

[11] Patent Number: 5,216,292
[45] Date of Patent: Jun. 1, 1993

[54] PULLUP RESISTANCE CONTROL INPUT CIRCUIT AND OUTPUT CIRCUIT

[75] Inventors: Taiji Imazu; Masao Takiguchi; Satoshi Matsumoto; Kazuharu Nishitani, all of Itami, Japan

[73] Assignee: Mitsubishi Denki Kabushiki Kaisha, Tokyo, Japan

[21] Appl. No.: 778,486

[22] Filed: Oct. 17, 1991

[30] Foreign Application Priority Data

Nov. 6, 1990 [JP] Japan .................. 2-301557
Jun. 4, 1991 [JP] Japan .................. 3-132468

[51] Int. Cl.$^5$ .................. H03K 17/16; H03K 19/90
[52] U.S. Cl. .................. 307/443; 307/451; 307/548; 307/579
[58] Field of Search .......... 307/443, 451, 547, 548, 307/550, 571, 572, 576, 579, 240

[56] References Cited

U.S. PATENT DOCUMENTS

| 4,553,045 | 11/1985 | Murotani | 307/548 |
| 4,612,466 | 9/1986 | Stewart | 307/579 |
| 4,785,203 | 11/1988 | Nakamura | 307/443 |
| 4,961,010 | 10/1990 | Davis | 307/548 |
| 5,036,222 | 7/1991 | Davis | 307/548 |
| 5,057,711 | 10/1991 | Lee et al. | 307/443 |

FOREIGN PATENT DOCUMENTS 221696 5/1990 Japan .

Primary Examiner—Edward P. Westin
Assistant Examiner—Andrew Sanders
Attorney, Agent, or Firm—Oblon, Spivak, McClelland, Maier & Neustadt

[57] ABSTRACT

In order to obtain an output circuit having pullup resistance which feeds no through current to a CMOS inverter even if output impedance of a front stage circuit is in an extremely high state, an input end and an output end of an inverter (G1) are connected to an input terminal ($P_i$) and a first input end of an AND gate (G5) respectively. A pulse generation circuit (SG) and a gate of a pullup transistor ($Q_1$) are connected to a second input end and an output end of the AND gate (G5) respectively. The pullup transistor ($Q_1$) has a drain and a source which are connected to the input terminal ($P_i$) and a power source ($V_{DD}$) respectively. An input end of a CMOS inverter (11) is connected to the input terminal ($P_i$). Even if the front stage output impedance is extremely increased after the potential of the input terminal ($P_i$) has been at a low logical level, the pullup transistor ($Q_1$) is quickly driven by pulses generated by the pulse generation circuit (SG), to increase the potential of the input end of the inverter (11).

19 Claims, 15 Drawing Sheets

PULLUP RESISTANCE CONTROL INPUT CIRCUIT AND OUTPUT CIRCUIT

BACKGROUND OF THE INVENTION

1. Field of the Invention

The present invention relates to a technique for controlling the ON resistance of a pullup transistor which is provided in an input/output buffer circuit.

2. Description of the Background Art

FIG. 12 is a circuit diagram showing a conventional input buffer circuit which comprises a pullup transistor.

A PMOS transistor $Q_2$ has a drain which is connected to an output terminal $P_o$, a source which is connected to a high potential power source $V_{DD}$, and a gate which is connected to an input terminal $P_i$. An NMOS transistor $Q_3$ has a drain which is connected to the output terminal $P_o$, a source which is connected to a low potential power source $V_{SS}$ (ground in this case), and a gate which is connected to the input terminal $P_i$. Namely, the MOS transistors $Q_2$ and $Q_3$ form a CMOS inverter 11, which has a transition voltage $V_{IT}$ ($V_{DD} > V_{IT} > V_{SS}$).

On the other hand, a PMOS transistor $Q_1$ is connected to the input terminal $P_i$ as a pullup transistor. This PMOS transistor $Q_1$ has a drain which is connected to the input terminal $P_i$, a source which is connected to the power source $V_{SS}$, and a gate which is connected to the power source $V_{DD}$. The potential of the power source $V_{DD}$ is hereinafter also indicated by $V_{DD}$. This also applies to the other power source $V_{SS}$.

The conventional input buffer circuit is thus formed by the inverter 11 and the PMOS transistor $Q_1$, and two types of logical levels are inputted in the input terminal $P_i$ from a front stage circuit. This can equivalently be regarded as that a front stage output impedance $Z_o$ and a square-wave oscillator outputting a potential $V_i$ ($V_i$ takes binary levels) are connected to the input terminal $P_i$.

The operation of the input buffer circuit shown in FIG. 12 is now described.

First, consider that the input terminal $P_i$ enters a high impedance state (hereinafter referred to as "Z state"), i.e., the front stage output impedance $Z_o$ is extremely increased. Such a state is caused when the front stage circuit has an open drain type output part with a plurality of pulldown transistors $Q_d$ as shown in FIG. 14 and all pulldown transistors $Q_d$ are converted from ON states (conducting states) to OFF states (cutoff states), for example. Referring again to FIG. 12, the PMOS transistor $Q_1$, which is a pullup transistor, is regularly in an ON state since its gate is connected with the power source $V_{SS}$, and connects the input terminal $P_i$ to the power source $V_{DD}$ with its ON resistance. Thus, the potential of the input terminal $P_i$ is set at a high logical level. Since a through current is most increased in the vicinity of the transition voltage $V_{IT}$ of the inverter 11, the potential of the input terminal $P_i$ is controlled to not be around the transition voltage $V_{IT}$ of the inverter 11, thereby avoiding breakage of the MOS transistors $Q_2$ and $Q_3$ caused by flow of the through current to the MOS transistors $Q_2$ and $Q_3$. Namely, the PMOS transistor $Q_2$ is brought into an OFF state and the NMOS transistor $Q_3$ is brought into an ON state, to bring the potential of the input terminal $P_i$ to a high logical level. At this time, the output terminal $P_o$ is connected with the power source $V_{SS}$, to output a low logical level.

When a logical level $V_H$ which is higher than the transition voltage $V_{IT}$ is inputted in the input terminal $P_i$, the PMOS transistor $Q_2$ enters an OFF state and the NMOS transistor $Q_3$ enters an ON state. Therefore, the output terminal $P_o$ is connected with the power source $V_{SS}$, to output a low logical level.

When a logical level $V_L$ which is lower than the transition voltage $V_{IT}$ is inputted in the input terminal $P_i$, on the other hand, the PMOS transistor $Q_2$ enters an ON state and the NMOS transistor $Q_3$ enters an OFF state. Therefore, the output terminal $P_o$ is connected with the power source $V_{DD}$, to output a high logical level.

Since the PMOS transistor $Q_1$ connects the input terminal $P_i$ to the power source $V_{DD}$ with its ON resistance, the potential of the input terminal $P_i$ is determined by resistance division of the front stage output impedance $Z_o$ and this ON resistance. When a high logical level transition voltage of the overall input buffer circuit shown in FIG. 12 is set as $V_{IH}$ ($> V_{IT}$) and a low logical level transition voltage is set as $V_{IL}$ ($< V_{IT}$), therefore, the ON resistance is so determined that the potential of the input terminal $P_i$ becomes higher than the transition voltage $V_{IT}$ if the potential $V_i$ of the square wave oscillator satisfies $V_i > V_{IH}$ while the potential of the input terminal $P_i$ becomes lower than the transition voltage $V_{IT}$ if the potential $V_i$ satisfies $V_i < V_{IL}$. In more concrete terms, this is implemented by properly designing the transistor size of the PMOS transistor $Q_1$.

FIG. 13 is a timing chart showing such a case that the above operations are continuously performed. It is assumed here that the potential $V_i$ of the oscillator takes either the potential $V_{DD}$ or $V_{SS}$, for the purpose of simplification. In advance of a time $t_1$, a high logical level (potential $V_{DD}$ in this case) is inputted in the input terminal $P_i$ (this state is hereinafter referred as "state H"), and a low logical level (potential $V_{SS}$ in this case) is outputted at the output terminal $P_o$ (this state is hereinafter referred to as "state L"). Between the time $t_1$ and a time $t_2$, a low logical level ($V_C$) is inputted in the input terminal $P_i$, and a high logical level (potential $V_{DD}$ in this case) is outputted at the output terminal $P_o$. The potential $V_C$ is slightly higher than the potential $V_i$ ($= V_{SS}$) of the oscillator. This is because the potential difference $V_{DD} - V_{SS}$ is resistance-divided by the front stage output impedance $Z_o$ and the ON resistance of the NMOS transistor $Q_1$, as hereinabove described. After the time $t_2$, the front stage output impedance $Z_o$ is increased in a Z state, and the potential of the input terminal $P_i$ is raised to the potential $V_{DD}$ by the PMOS transistor $Q_1$, while the potential of the output terminal $P_o$ reaches the potential $V_{SS}$.

Such a pullup transistor is also employed in an output buffer circuit. FIG. 15 is a circuit diagram showing a conventional output buffer circuit which comprises a pullup transistor.

A PMOS transistor $Q_4$ has a drain which is connected to an output terminal $P_{oo}$, a source which is connected to a power source $V_{DD}$, and a gate which is connected to an output end of a NAND gate G3. An NMOS transistor $Q_5$ has a drain which is connected to the output terminal $P_{oo}$, a source which is connected to a power source $V_{SS}$, and a gate which is connected to an output end of a NOR gate G4. Namely, the MOS transistors $Q_4$ and $Q_5$ form a tristate type CMOS inverter 21.

Gates G2, G3 and G4 form a tristate type control circuit 20. The gate G2 is an inverter, whose input end is connected to a drive allowing input terminal $P_{i1}$. First and second input ends of the NAND gate G3 are connected to an output end of the gate G2 and a drive selecting input terminal $P_{i2}$ respectively. First and second input ends of the NOR gate G4 are connected to the drive allowing input terminal $P_{i1}$ and the drive selecting input terminal $P_{i2}$ respectively.

On the other hand, a PMOS transistor $Q_6$ is connected to the output terminal $P_{oo}$ as a pullup transistor. This PMOS transistor $Q_6$ has a drain which is connected to the output terminal $P_{oo}$, a source which is connected to the power source $V_{SS}$, and a gate which is connected to the power source $V_{DD}$.

The control circuit 20, the inverter 21 and the PMOS transistor $Q_6$ form an output buffer circuit $A_0$. Further, n output buffer circuits having similar structures are connected in common with the output terminal $P_{oo}$. The output terminal $P_{oo}$ transmits signals to a next stage circuit. An input buffer circuit 40 of the next stage circuit has a transition voltage $V_{IT}$.

The operation is now described.

In order to select one from the plurality of output buffer circuits $A_0$ to $A_n$, a low logical level is inputted in the drive allowing input terminal $P_{i1}$ (state L). It is assumed here that such a low logical level is inputted in the drive allowing input terminal $P_{i1}$ of the output buffer circuit $A_0$, to select the output buffer circuit $A_0$.

When a high logical level is inputted in the drive selecting input terminal $P_{i2}$ of the output buffer circuit $A_0$ (state H) in this case, the output of the NAND gate G3 enters a state L and the PMOS transistor $Q_4$ enters an ON state, while the output of the NOR gate G4 also goes to a low logical level and the NMOS transistor $Q_5$ enters an OFF state. Consequently, a high logical level is outputted at the output terminal $P_{oo}$ (state H). When a low logical level is inputted in the drive selecting input terminal $P_{i2}$ (state L), on the other hand, the PMOS transistor $Q_4$ enters an OFF state while the NMOS transistor $Q_5$ enters an ON state, and a low logical level is outputted at the output terminal $P_{oo}$ (state L).

When none of the output circuits $A_0$ to $A_n$ is selected, i.e., when the drive selecting input terminal of every one of the output circuits $A_0$ to $A_n$ is in a state H, the output of the NAND gate G3 enters a state H and the PMOS transistor $Q_4$ enters an OFF state in each of the output buffer circuits $A_0$ to $A_n$. At the same time, the output of the NOR gate G4 enters a state L, and the NMOS transistor $Q_5$ also enters an OFF state. Consequently, the output (drain terminal common junction) of the inverter 21 itself enters a Z state, to generate no output. However, the output terminal $P_{oo}$ enters a state H since the PMOS transistor $Q_6$ is regularly in an ON state due to the potential $V_{SS}$ applied to its gate. Thus, a floating state of the output terminal $P_{oo}$ is so avoided that it is possible to avoid flow of a through current even if the next stage input buffer circuit 40 has a CMOS structure similarly to the inverter 11 shown in FIG. 12.

If the output terminal $P_{oo}$ is in a state L when the output circuit $A_0$ is selected, i.e., the drive allowing input terminal $P_{i1}$ is in a state L, the PMOS transistor $Q_4$ is in an ON state (the NMOS transistor $Q_5$ is in an OFF state), and the potential of the output terminal $P_{oo}$ in the state L is determined by resistance division of the ON resistance of the PMOS transistor $Q_6$ and the ON resistance of the PMOS transistor $Q_4$ since the PMOS transistor $Q_6$ is regularly in an ON state. Thus, the PMOS transistor $Q_6$ is so designed that the relation between a high logical level transition voltage $V_{OH}$ and a low logical level transition voltage $V_{OL}$ of each of the output circuits $A_0$ to $A_n$ and the transition voltage $V_{IT}$ of the input buffer circuit 40 is $V_{OH} > V_{IT} > V_{OL}$.

Since the conventional input and output buffer circuits have the aforementioned structures, it is possible to avoid a through current in the inverter 11 of the input buffer circuit when the output part of the front stage circuit enters a Z state, while a through current in an inverter of the next stage circuit can be avoided in the output buffer circuit.

However, since the PMOS transistors $Q_1$ and $Q_6$, which are pullup transistors, are regularly in ON states in order to attain the respective effects, unwanted currents flow to the same to cause undesired power consumption.

As to the input buffer circuit, a current inevitably flows to the PMOS transistor $Q_1$ when a low logical level is inputted in the input terminal $P_i$ in FIG. 12, to consume undesired power.

As to the output buffer circuit, on the other hand, a current inevitably flows to the PMOS transistor $Q_6$ when a low logical level is outputted at the output terminal $P_{oo}$ in FIG. 15, to consume undesired power.

SUMMARY OF THE INVENTION

The present invention has been proposed to solve the aforementioned problems of the prior art, and an object thereof is to provide an input circuit which feeds no through current to MOS transistors provided therein and which can avoid undesired power consumption in a pullup transistor caused by an unwanted current.

Another object of the present invention is to provide an output circuit which feeds no through current to a next stage MOS transistor, and which can avoid undesired power consumption in a pullup transistor caused by an unwanted current.

In the first aspect of the present invention, a pullup resistance control input circuit comprises an input terminal, an output terminal, an input buffer circuit, a first transistor, and a logic inversion circuit.

The input buffer circuit is provided between high and low potential points, and has an input end which is connected to the input terminal, an output end which is connected to the output terminal, and a first inversion voltage.

The first transistor has a first electrode being connected to the input terminal, a second electrode being connected to the high potential point and a control electrode, the first transistor being driven to an ON state when the control electrode has a relatively low potential while being driven to an OFF state when the control electrode has a relatively high potential.

The logic invertion circuit has an input end being connected to the input terminal and an output end being connected to the control electrode of the first transistor.

In the second aspect of the present invention, a pullup resistance control input circuit comprises an input terminal, an output terminal, an input buffer circuit, a first transistor, and a first logic inversion circuit.

The input buffer circuit is provided between high and low potential points, and has an input end which is connected to the input terminal, an output end which is connected to the output terminal, and a first inversion voltage.

The first transistor has a first electrode which is connected to the input terminal, a second electrode which is connected to a high potential point, and a control electrode. This transistor is driven to an ON state when the control electrode has a relatively low potential, while the same is driven to an OFF state when the control electrode has a relatively high potential.

The first logic inversion circuit has an input end which is connected to the input terminal, and an output end which is connected to the control electrode of the first transistor. This circuit outputs the relatively low potential to the control electrode of the first transistor when the potential of the input terminal is higher than a second transition voltage, while the same outputs intermittent pulses reaching the relatively low potential on the basis of the relatively high potential to the control electrode of the first transistor when the potential of the input terminal is lower than the second transition voltage.

In the third aspect of the present invention, the first logic inversion circuit of the invention according to the second aspect comprises a pulse generation circuit outputting the intermittent pulses, an inverter and an AND gate.

The inverter has an input end which is connected to the input end of the first logic inversion circuit and an output end which is connected to a first input end of the AND gate respectively.

In addition to the first input end which is connected to the inverter, the AND gate has a second input end which is connected to the pulse generation circuit. An output end of the AND gate is connected to the output end of the first logic inversion circuit.

In the fourth aspect of the present invention, a pullup resistance control input circuit is obtained by adding a second logic inversion circuit to the invention according to the second aspect.

The second logic inversion circuit has a fourth transistor of the same polarity as the first transistor having a first electrode which is connected to the input terminal, a second electrode which is connected to the high potential point, and a control electrode, an input end of which is connected to the input terminal, and an output end of which is connected to the control electrode of the fourth transistor. This circuit outputs the relatively low potential to the control electrode of the fourth transistor when the potential of the input terminal is higher than the second transition voltage, while the same outputs the relatively high potential to the control electrode of the fourth transistor when the potential of the input terminal is lower than the second transition voltage.

In the fifth aspect of the present invention, a pullup resistance control output circuit comprises a drive allowing input terminal, a drive selecting input terminal, an output terminal, a tristate control circuit, an output buffer circuit, a first transistor, and a first logic inversion circuit.

The tristate control circuit has a first drive output end and a second drive output end which are controlled by signals from the drive allowing input terminal and the drive selecting input terminal.

The output buffer circuit is provided between high and low potential points, and has a first input end which is connected to the first drive output end, a second input end which is connected to the second output end, and an output end which is connected to the output terminal, and a first transition voltage.

The first transistor has a first electrode which is connected to the output terminal, a second electrode which is connected to the high potential point, and a control electrode. This transistor is driven to an ON state when the control electrode has a relatively low potential, and is driven to an OFF state when the control electrode has a relatively high potential.

The first logic inversion circuit has an input end which is connected to the output terminal, and an output end which is connected to the control electrode of the first transistor.

In the sixth aspect of the present invention, provided is a pullup resistance control output circuit similar to that according to the fifth aspect, wherein the first logic inversion circuit has a second transition voltage, and the relatively low potential is outputted at the output end of the first logic inversion circuit when the potential of the input end of the first logic inversion circuit is higher than the second transition voltage, while the relatively high potential is outputted at the output end of the first logic inversion circuit when the potential of the input end of the first logic inversion circuit is lower than the second transition voltage.

In the seventh aspect of the present invention, provided is a pullup resistance control output circuit similar to that according to the fifth aspect, wherein the first logic inversion circuit has a second transition voltage, and the relatively low potential is outputted at the output end of the first logic inversion circuit when the potential of the input end of the first logic inversion circuit is higher than the second transition voltage, while forward intermittent pulses reaching the relatively low potential on the basis of the relatively high potential are outputted at the output end of the first logic inversion circuit when the potential of the input end of the first logic inversion circuit is lower than the second transition voltage.

In the eighth aspect of the present invention, the first logic inversion circuit of the invention according to the seventh aspect comprises a pulse generation circuit generating the intermittent pulses, an inverter and an AND gate.

The inverter has an input end which is connected to the input end of the first logic inversion circuit, and an output end which is connected to the first input end of the AND gate respectively.

In addition to the first input end which is connected with the inverter, the AND gate has a second input end which is connected to the pulse generation circuit. An output end of the AND gate is connected to the output end of the first logic inversion circuit.

In the ninth aspect of the present invention, provided is a pullup resistance control output circuit similar to that according to the seventh aspect, which further comprises a fourth transistor and a second logic inversion circuit.

The fourth transistor is a transistor of the same polarity as the first transistor, and has a first electrode which is connected to the output terminal, a second electrode which is connected to the high potential power source and a control electrode.

The second logic inversion circuit has an input end which is connected to the output terminal and an output end which is connected to the control electrode of the fourth transistor. This circuit outputs the relatively low potential to the control electrode of the fourth transistor when the potential of the output terminal is higher than the second transition voltage, while the same outputs the relatively high potential to the control electrode of the fourth transistor when the potential of the input terminal is lower than the second transition voltage.

According to the present invention of the first aspect, the first transistor serves as a pullup resistor which connects the input terminal to the high potential power source when the potential of the input terminal is at a high logical level, while the input terminal is not connected to the high potential power source when the potential of the input terminal is at a low logical level, whereby flow of an unwanted current is avoided in the first transistor.

According to the present invention of the second and third aspects, the first logic inversion circuit intermittently drives the pullup transistor to an ON state when the potential of the input terminal is at a low logical level, whereby the input terminal is quickly converted to a high potential logical level when the output of the front stage circuit received in the input terminal enters a high impedance state from a low logical level.

According to the present invention of the fourth aspect, the fourth transistor serves as a pullup resistor with the first transistor according to the second aspect. However, the second logic inversion circuit intermittently drives only the first transistor to an ON state when the input terminal is at a low logical level. Thus, no unwanted current flows to the fourth transistor.

According to the present invention of the fifth and sixth aspects, the first transistor serves as a pullup resistor for connecting the output terminal to the high potential power source when the potential of the output terminal is not at a low logical level, while the output terminal is not connected to the high potential power source when the potential of the output terminal is at the low logical level, whereby flow of an unwanted current is avoided.

According to the present invention of the seventh and eighth aspects, the first logic inversion circuit intermittently drives the pullup transistor to an ON state when the potential of the output terminal is at a low logical level, whereby the output terminal is quickly converted to a high potential logical level when the output of the output buffer circuit enters a high impedance state from a low logical level.

According to the present invention of the ninth aspect, the fourth transistor serves as a pullup resistor with the first transistor according to claim 4. However, the second logic inversion circuit intermittently drives only the first transistor to an ON state when the output terminal is at a low logical level. Thus, no unwanted current flows to the fourth transistor.

It is understood from the above description that the present invention has the following effects:

According to the present invention of the first aspect, the first transistor will not connect the input terminal to the high potential power source when the potential of the input terminal is at a low logical level, and hence it consumes no undesired power, while it serves as a pullup resistor which connects the input terminal to the high potential power source when the potential of the input terminal is at a high logical level.

Further, it is possible to avoid flow of a through current to the input buffer circuit when the input terminal is in a high impedance state by rendering the transition voltage of the logic inversion circuit controlling driving of the first transistor lower than the transition voltage of the input buffer circuit.

According to the present invention of the second and third aspects, the first transistor is intermittently driven to an ON state when the potential of the input terminal is at a low logical level, whereby the input terminal is quickly connected to the high potential power source when the output of the front stage circuit received in the input terminal enters a high impedance state from a low logical level, to avoid flow of a through current to the input buffer circuit and provide stable power to the next stage. Further, power consumption is small since the driving is intermittent.

According to the present invention of the fourth aspect, the first and fourth transistors quickly connect the input terminal to the high potential power source with lower pullup resistance when the output of the front stage circuit received in the input terminal enters a high impedance state from a low logical level.

Further, only the first transistor is intermittently driven when the input terminal is not in a high impedance state but at a low logical level, whereby undesired power consumption is suppressed.

According to the present invention of the fifth and sixth aspects, the first transistor will not connect the output terminal to the high potential power source when the potential of the output terminal is at a low logical level, and hence it consumes no undesired power, while it serves as a pullup resistor which connects the output terminal to the high potential power source when the potential of the output terminal is not at a low logical level.

According to the invention of the seventh and eighth aspects, the first transistor is intermittently driven to an ON state when the potential of the output terminal is at a low logical level, whereby the output terminal is at a low logical level, whereby the output termianl is quickly connected to the high potential power source when the next stage circuit to which the output of the output terminal is transmitted enters a high impedance state from a low logical level, to avoid flow of a through current to the input buffer circuit of the next stage circuit and provide stable power to the next stage. Further, power consumption is small since driving is intermittent.

According to the invention of the ninth aspect, the first and fourth transistors quickly connect the output terminal to the high potential power source with lower pullup resistance when the next stage circuit to which the output of the output terminal is transmitted enters a high impedance state from a low logical level.

Further, only the first transistor is intermittently driven when the output terminal is not in a high impedance state but at a low logical level, whereby undesired power consumption is suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
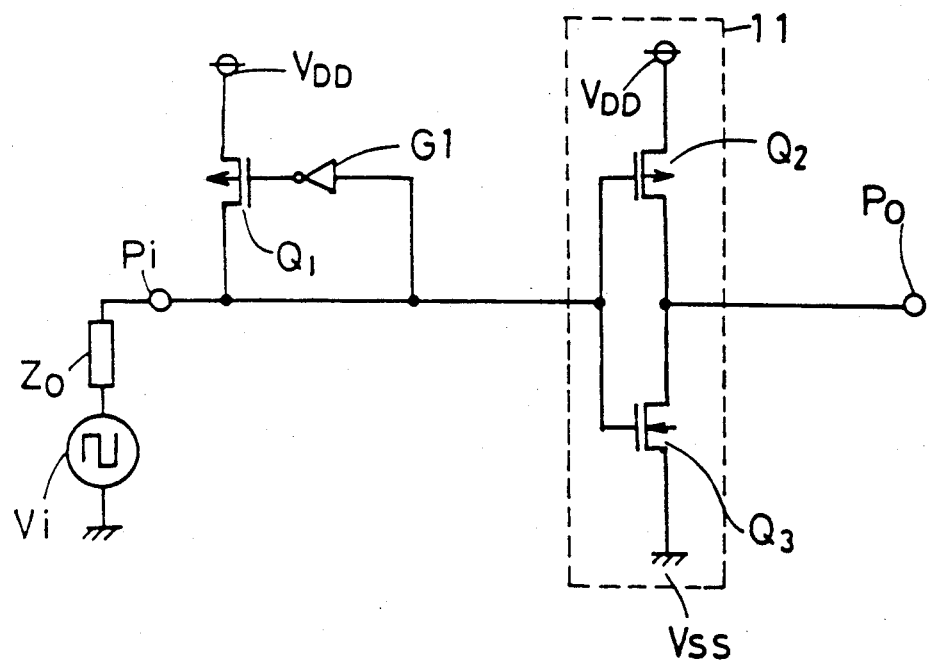
FIG. 3 is a circuit diagram showing a pullup resistance control input circuit according to a first embodiment of the present invention.

FIG. 3 is a circuit diagram showing a pullup resistance control input circuit according to a first embodiment of the present invention. An inverter 11 is connected between an input terminal $P_i$ and an output terminal $P_o$. Similarly to the conventional input buffer circuit, the inverter 11 is formed by a PMOS transistor $Q_2$ and an NMOS transistor $Q_3$. Namely, the PMOS transistor $Q_2$ has a drain which is connected to the output terminal $P_o$, a source which is connected to a high potential power source $V_{DD}$, and a gate which is connected to the input terminal $P_i$. The NMOS transistor $Q_3$ has a drain which is connected to the output terminal $P_o$, a source which is connected to a low potential power source $V_{DD}$ (ground in this case), and a gate which is connected to the input terminal $P_i$. The inverter 11 has a transition voltage $V_{IT}$ ($V_{DD} > V_{IT} > V_{SS}$).

The PMOS transistor $Q_1$, which is a pullup transistor, also has a drain which is connected to the input terminal $P_i$ and a source which is connected to the power source $V_{SS}$ similarly to the conventional input buffer circuit, while its gate is connected to an output end of an inverter G1. An input end of the inverter G1 is connected to the input terminal $P_i$. A transition voltage $V_{RT}$ of this inverter G1 is set to be higher than the transition voltage is set to be lower than a high logical level transition voltage $V_{IH}$ in the overall input circuit. On the other hand, a low logical level transition voltage $V_{IL}$ in the overall input circuit is set to be lower than the transition voltage $V_{IT}$ of the inverter 11. Namely, the interrelation between the transition voltages is as follows:

$$V_{IH} > V_{IT} > V_{RT} > V_{IL} \tag{1}$$

As to a transition voltage of an inverter having a CMOS structure which is formed by a PMOS transistor and an NMOS transistor, a schematic value can generally be obtained in the following formula:

$$V_{TH} = \frac{V_{DD} - |V_{THP}| + K \cdot V_{THN}}{1 + K}, K^2 = \frac{\beta_N}{\beta_P} \tag{2}$$

where
$V_{TH}$: transition voltage of inverter
$V_{DD}$: high potential power source level
$V_{THP}$: threshold voltage of PMOS transistor
$V_{THN}$: threshold voltage of NMOS transistor
K: conductance ratio of PMOS transistor to NMOS transistor
$\beta_P$: conductance of PMOS transistor
$\beta_N$: conductance of NMOS transistor The respective voltages are based on the level of the low potential power source.

The conductances $\beta_P$ and $\beta_N$ are substantially proportionate to W/L assuming that W represents the gate width of each MOS-FET and L represents the gate length. Therefore, it is possible to control the transition voltage $V_{IT}$ by properly designing the transistor sizes (gate widths W and gate lengths L) of the PMOS transistor $Q_2$ and the NMOS transistor $Q_3$ for forming the inverter 11. Thus, the inverter 11 can be designed to satisfy the above relation (1).

The operation of the input circuit according to the first embodiment is now described. First, description is made on the operation performed in such a case that a signal is externally applied to the input terminal $P_i$, i.e., when a front stage output impedance $Z_o$ is small.

When a signal level $V_{IN}$ applied to the input terminal $P_i$ is higher than the high logical level transition voltage $V_{IH}$ of the input circuit (state H) and hence the same is higher than the transition voltage $V_{IT}$ of the inverter 11, the PMOS transistor $Q_2$ forming the inverter 11 enters an OFF state, and the NMOS transistor $Q_3$ enters an ON state. Thus, the output terminal $P_o$ is connected to the power source $V_{SS}$, to output a low logical level (state L).

Since the signal level $V_{IN}$ applied to the input terminal $P_i$ is higher than the transition voltage $V_{RT}$ of the inverter 11 at this time, the inverter 11 supplies a low logical level to the gate of the PMOS transistor $Q_1$, so that the PMOS transistor $Q_1$ enters an ON state. Thus, the input terminal $P_i$ is connected with the power source $V_{DD}$ through the PMOS transistor $Q_1$, and maintained in the state H.

Figure 12:
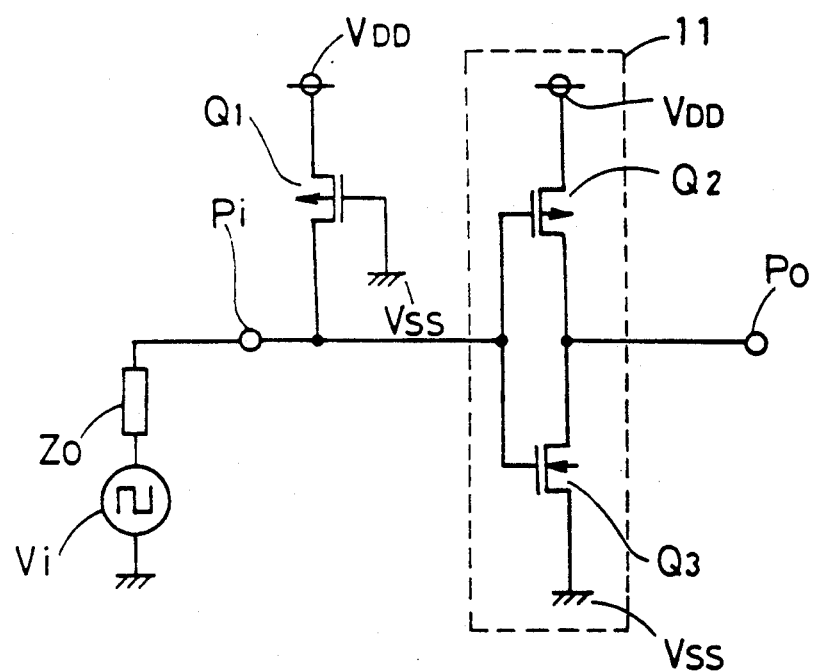
FIG. 12 is a circuit diagram showing a conventional input buffer circuit.

Namely, the operation of the pullup transistor is similar to that of the prior art shown in FIG. 12 in this case.

When the signal level $V_{IN}$ applied to the input terminal $P_i$ is lower than the low logical level transition voltage $V_{IL}$ of the input circuit (state L) and hence the same is lower than the transition voltage $V_{IT}$ of the inverter 11, on the other hand, the PMOS transistor $Q_2$ forming the inverter 11 enters an ON state, and the NMOS transistor $Q_3$ enters an OFF state. Thus, the output terminal $P_o$ is connected with the power source $V_{DD}$, to output a high logical level. The operation of the inverter 11 is similar to that of the prior art also in this case.

Since the signal level $V_{IN}$ applied to the input terminal $P_i$ is lower than the transition voltage $V_{RT}$ of the inverter G1, the inverter G1 supplies a high logical level potential to the gate of the PMOS transistor $Q_1$, so that the PMOS transistor $Q_1$ enters an OFF state. As the result, it is possible to effectively inhibit flow of a current from the power source $V_{DD}$ to the input terminal $P_i$ through the NMOS transistor $Q_1$, to avoid undesired power consumption which has generally been caused when the input terminal $P_i$ is in a state L.

Description is now made on the operation performed when the input terminal $P_i$ is converted from a state externally supplied with a signal to a state supplied with no signal in such a case that the front stage output impedance $Z_o$ is extremely high to cause a Z state.

When the state L in which the signal level $V_{IN}$ applied to the input terminal $P_i$ is lower than the low logical level transition voltage $V_{IL}$ ($<V_{RT}$) (the potential of the output terminal $P_o$ is at a high logical level in this state) is converted to a Z state, the PMOS transistor $Q_1$ is in an OFF state since the potential of the input terminal $P_i$ is lower than the transition voltage $V_{RT}$ of the inverter G1, and the potential of the input terminal $P_i$ is maintained at a low logical level. Namely, no through current flows to the inverter 11.

Figure 4:
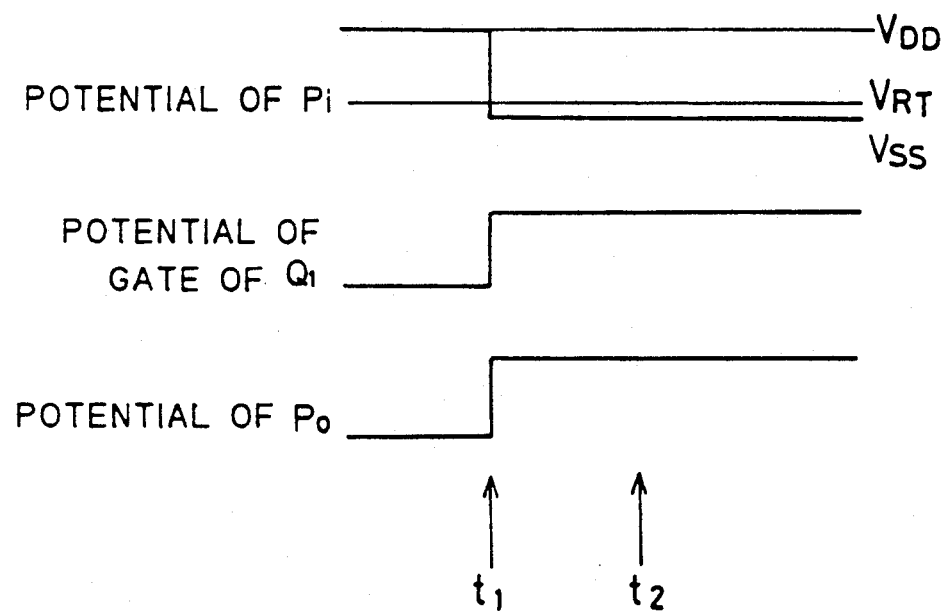
FIG. 4 is a timing chart showing the operation of the pullup resistance control input circuit shown in FIG. 3.
Figure 13:
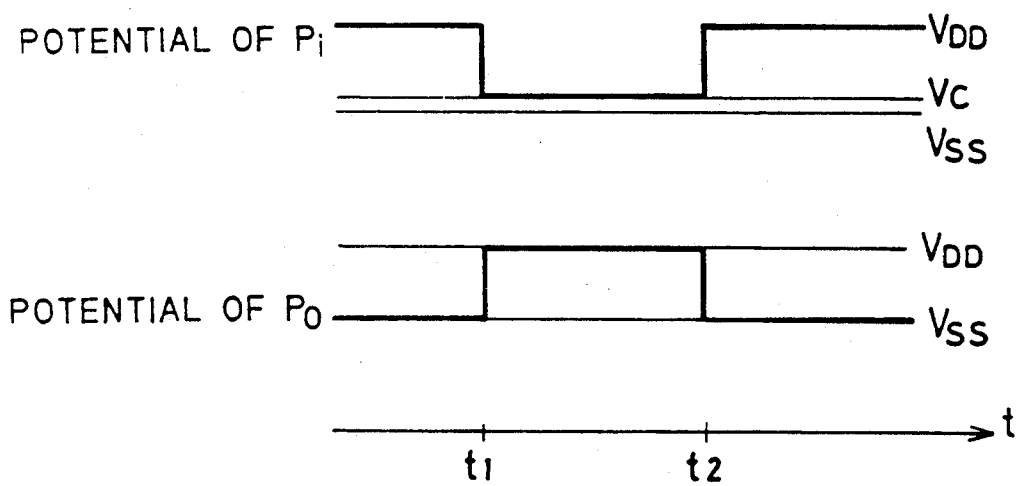
FIG. 13 is a timing chart showing the operation of the conventional input buffer circuit.
Figure 14:
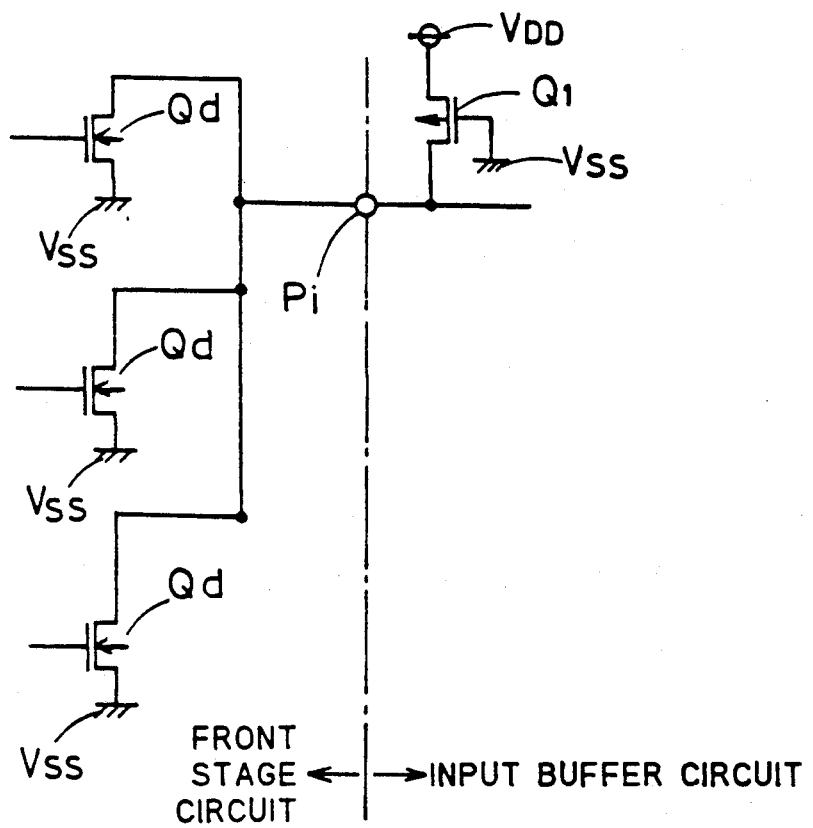
FIG. 14 is a circuit diagram showing such an example that an input terminal $P_i$ enters a high impedance state (Z state)

FIG. 4 is a timing chart showing such a case that the aforementioned operations are continuously made. Similarly to FIG. 13, it is assumed that the potential $V_i$ of the oscillator takes either the potential $V_{DD}$ or $V_{SS}$, for the purpose of simplification. In advance of a time $t_1$, the input terminal $P_i$ is in a state H, and the gate of the PMOS transistor $Q_1$ has a low logical level by the inverter G1 so that the PMOS transistor $Q_1$ is in an ON state, while the output terminal $P_o$ is in a state L. Between the time $t_1$ and a time $t_2$, the input terminal $P_i$ enters a state L. At this time, the inverter G1 supplies a high logical level to the gate of the PMOS transistor $Q_1$, so that the PMOS transistor $Q_1$ is in an OFF state. Dissimilarly to the conventional circuit shown in FIG. 13, therefore, the potential of the input terminal $P_i$ is not raised to a potential $V_C$ in the state H, but reaches the potential $V_{SS}$. After the time $t_2$, a Z state is attained and the input terminal $P_i$ maintains the state before the time $t_2$, i.e., the state L. Thus, the output terminal $P_o$ maintains the state H.

When the input terminal $P_i$ is thus in a Z state, however, there is no factor for forcibly setting the potential of the input terminal $P_i$, and hence the potential of the input terminal $P_i$ may be raised by leakage of the PMOS transistor $Q_1$, for example. If this state is left intact, the potential of the input terminal $P_i$ finally reaches the transition voltage $V_{IT}$ of the inverter 11, to feed a large through current thereto. Such a trouble can be avoided by setting the transition voltage $V_{RT}$ of the inverter G1 to be smaller than the transition voltage $V_{IT}$ of the inverter 11. This avoidance is now described.

When the potential of the input terminal $P_i$ is still smaller than the transition voltage $V_{RT}$ of the inverter G1, the same is smaller than the transition voltage $V_{IT}$ of the inverter 11 and hence the output terminal $P_o$ supplies a low logical level to the inverter 11.

When the potential of the input terminal $P_i$ is raised beyond the transition voltage $V_{RT}$ of the inverter G1, however, the inverter outputs a low logical level to bring the PMOS transistor $Q_1$ into an ON state, and the input terminal $P_i$ is inverted to a high logical level through the PMOS transistor $Q_1$.

At this time, the potential of the input terminal $P_i$ will not take a value around the transition voltage $V_{IT}$ of the inverter 11, since the potential of the input terminal $P_i$ immediately reaches a value around the potential $V_{DD}$ beyond the potential $V_{IT}$ when the same starts rising from the potential $V_{RT}$. Thus, it is possible to avoid flow of a through current to the inverter 11.

When the input terminal $P_i$ is converted from a state H to a Z state, its potential will not fluctuate since the same is defined by the power source $V_{DD}$ through the PMOS transistor $Q_1$.

Namely, the input circuit shown in FIG. 3 feeds no through current to the inverter 11 even if the input terminal $P_i$ enters a Z state, similarly to the prior art. Dissimilarly to the prior art, further, it is possible to avoid undesired power consumption since the NMOS transistor $Q_1$ is in an OFF state even if the input terminal $P_i$ is in a state L.

Figure 1:
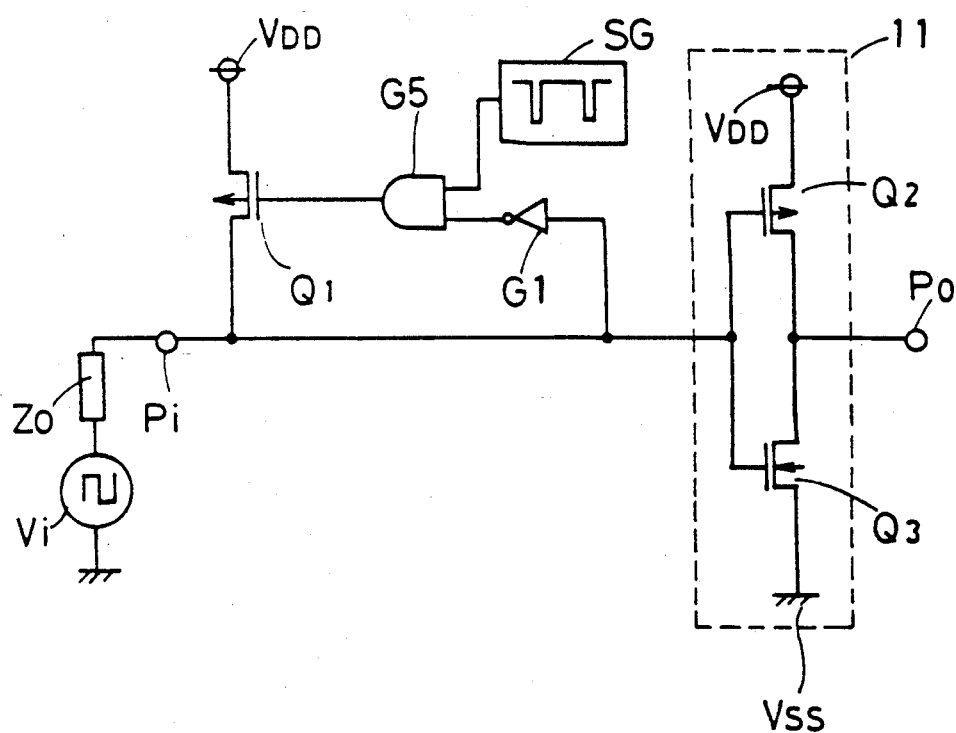
FIG. 1 is a circuit diagram showing a pullup resistance control input circuit according to a second embodiment of the present invention.

FIG. 1 is a circuit diagram showing a pullup resistance control input circuit according to a second embodiment of the present invention. An inverter 11 is connected between an input terminal $P_i$ and an output terminal $P_o$. Similarly to the input circuit according to the first embodiment, the inverter 11 is formed by a PMOS transistor $Q_2$ and an NMOS transistor $Q_3$. A PMOS transistor $Q_1$, which is a pullup transistor, has a drain which is connected to the input terminal $P_i$ and a source which is connected to a power source $V_{DD}$ similarly to the input circuit according to the first embodiment, while its gate is connected to an output end of an AND gate G5. A first input end of the AND gate G5 is connected to an output end of an inverter G1, while its second input end is connected to a pulse generation circuit SG. An input end of the inverter G1 is connected to the input terminal $P_i$, similarly to the first embodiment.

Figure 6:
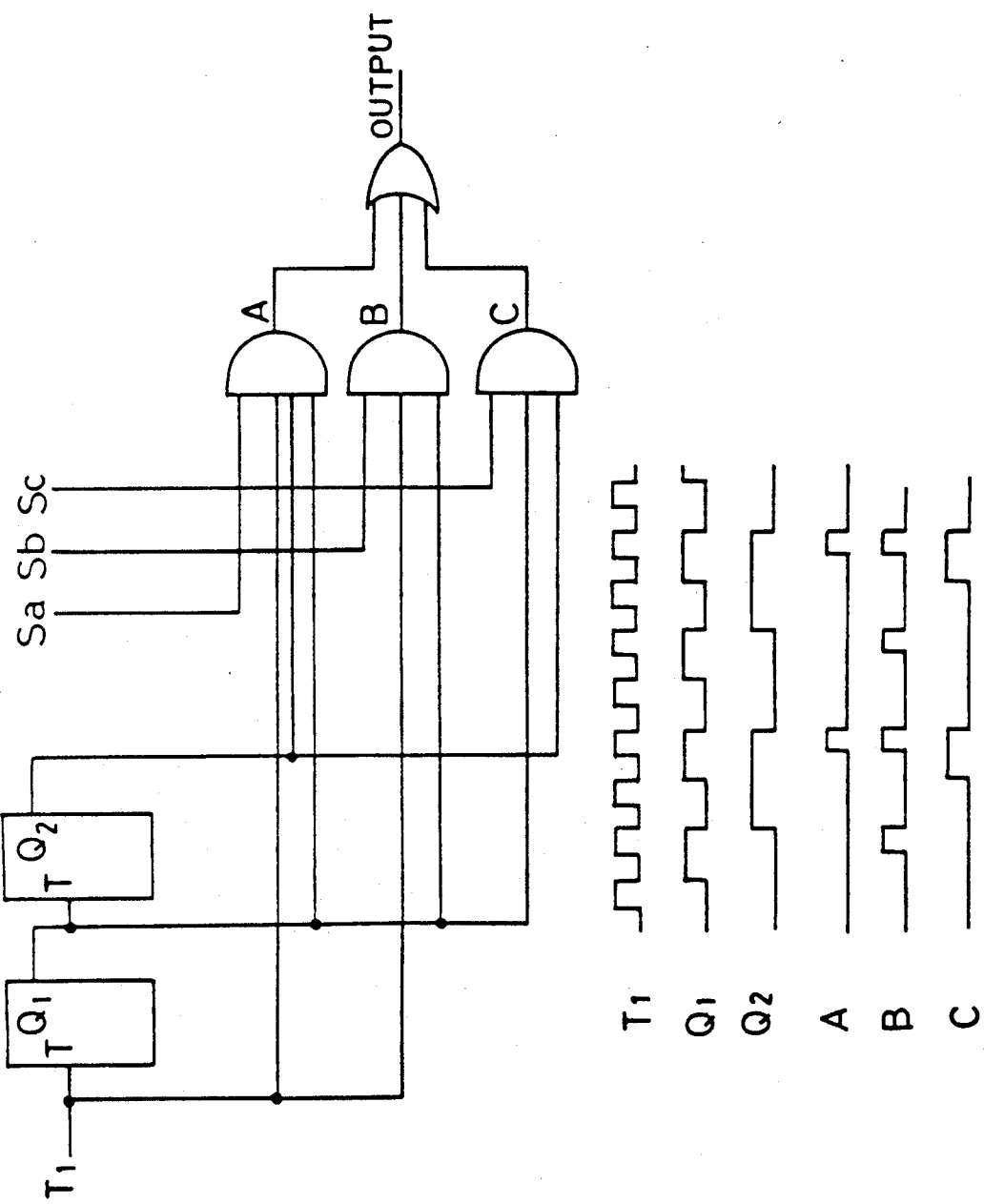
FIG. 6 is a circuit diagram showing an exemplary structure of a pulse generation circuit SG.

The pulse generation circuit SG intermittently outputs binary potentials of a value smaller than the transition voltage of the gate G5 (state L) and a value larger than the same (state H) as pulses. Such a circuit can be formed by a logic circuit shown in FIG. 6, for example. A signal T1 is a clock signal, and outputs A, B and C are obtained by bringing inputs Sa, Sb and Sc into states H respectively.

When the output of the inverter G1 is in a state H, the gate G5 transfers the output of the pulse generation circuit SG to the gate of the PMOS transistor $Q_1$, so that the PMOS transistor $Q_1$ is intermittently in an ON state.

The operation of the input circuit according to the second embodiment is now described. First, description is made on such a case that a signal is externally applied to the input terminal $P_i$, i.e., when a front stage output impedance $Z_o$ is small.

When the input terminal $P_i$ is in a state H, the inverter G1 supplies a low logical level to the first input end of the gate G5. In this case, therefore, the output end of the gate G5 enters a state L regardless of the output of the pulse generation circuit SG, to bring the PMOS transistor $Q_1$ into an ON state. Thus, the input terminal $P_i$ is connected to the power source $V_{DD}$, to maintain the state H. At this time, the output terminal $P_o$ outputs a low logical level by action of the inverter 11.

When the input terminal $P_i$ is in a state L, the inverter G1 supplies a high logical level to the first input end of the gate G5. In this case, therefore, the gate G5 generates an output in accordance with the output of the pulse generation circuit SG.

When the output of the pulse generation circuit SG is at a high logical level, i.e., the output of the gate G5 is in a state H in the aforementioned state, the PMOS transistor $Q_1$ is in an OFF state. Thus, the input terminal $P_i$ maintains the state L. This is similar to the operation in the first embodiment.

When the pulse generation circuit SG generates low logical level pulses, on the other hand, the output of the gate G5 also goes to a low logical level to bring the PMOS transistor $Q_1$ into an ON state. In this case, the potential of the input terminal $P_i$ is determined by resistance division of the impedance $Z_o$ and ON resistance of the PMOS transistor $Q_1$ similarly to the conventional input buffer circuit, and raised as compared with the case where the pulse generation circuit SG generates no low logical level pulses.

Then, consider that the input terminal $P_i$ enters a Z state. When the input terminal $P_i$ is converted from the state L to the Z state, the input end of the gate G1 is in a state L, and hence the gate G5 generates an output in accordance with the output of the pulse generation circuit SG.

When the output of the pulse generation circuit SG is at a high logical level, the PMOS transistor $Q_1$ is in an OFF state and the input terminal $P_i$ maintains the state L, while the PMOS transistor $Q_1$ enters an ON state when the pulse generation circuit SG outputs low logical level pulses, and the input terminal $P_i$ is connected with the power source $V_{DD}$ to be converted to a state H. Once the input terminal $P_i$ is converted to the state H, the gate G5 regularly brings the PMOS transistor $Q_1$ into an ON state by the output of the gate G1, while the state H is maintained in the input terminal $P_i$.

Figure 2:
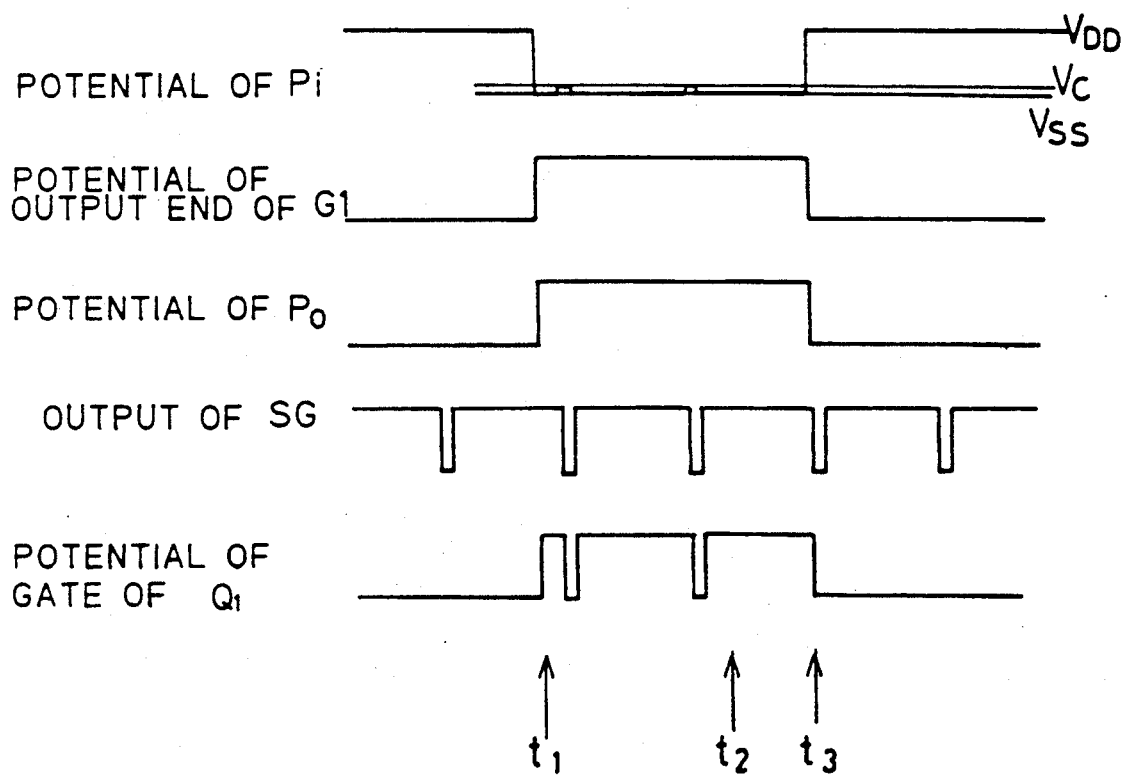
FIG. 2 is a timing chart showing the operation of the pullup resistance control input circuit shown in FIG. 1.

FIG. 2 is a timing chart showing such a case that the aforementioned operations are continuously made. Similarly to FIG. 13, it is assumed that the potential $V_i$ of the oscillator takes either the potential $V_{DD}$ or $V_{SS}$, for the purpose of simplification. In advance of a time $t_1$, the input terminal $P_i$ is in a state H, and the potential of the output terminal $P_o$ is at a low logical level regardless of the output of the circuit SG.

The input terminal $P_i$ enters a state L at the time $t_1$. When the output of the pulse generation circuit SG is at a high logical level, the potential of the input terminal $P_i$ reaches the potential $V_{SS}$ similarly to the first embodiment (FIG. 4), while the same reaches the potential $V_C$ similarly to the conventional case (FIG. 13) when the output of the pulse generation circuit SG is at a low logical level. Therefore, the potential of the input terminal $P_i$ is pulsated by the pulses generated from the pulse generation circuit SG, as shown in FIG. 2.

Then, the input terminal $P_i$ enters a Z state at a time $t_2$. While the input terminal $P_i$ maintains the state L when the output of the pulse generation circuit SG is at a high logical level, the PMOS transistor $Q_1$ enters an ON state by pulses generated from the pulse generation circuit SG at a time $t_3$, and hence the input terminal $P_i$ is converted to a state H.

Namely, according to the second embodiment, it is possible to quickly bring the potential of the output terminal $P_o$ to a low logical level since the pulse generation circuit SG intermittently generate pulses even if the input terminal $P_i$ enters a Z state.

On the other hand, the generated pulses intermittently feed an unwanted current to the PMOS transistor $Q_1$ when the input terminal $P_i$ is in a state L. However, the Z state of the input terminal $P_i$ can be sufficiently converted to a state H with only a narrow pulse width, as hereinabove described. Thus, it is possible to suppress power consumption caused by an unwanted current flowing to the PMOS transistor $Q_1$.

Figure 5:
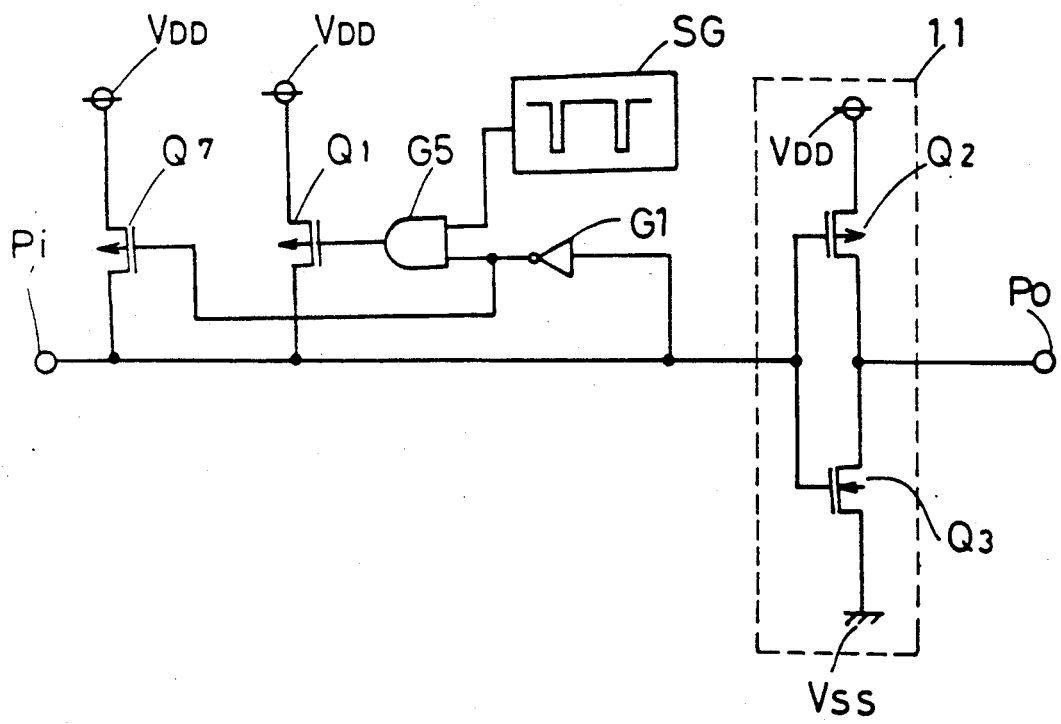
FIG. 5 is a circuit diagram showing a pullup resistance control input circuit according to a third embodiment of the present invention.

FIG. 5 is a circuit diagram showing a pullup resistance control input circuit according to a third embodiment of the present invention. A PMOS transistor $Q_7$ is further added to the second embodiment shown in FIG. 1 as a pullup transistor. The PMOS transistor $Q_7$ has a drain which is connected to an input terminal $P_i$, a source which is connected to a power source $V_{DD}$, and a gate which is connected with an output end of an inverter G1.

The operation of the input circuit having the aforementioned structure is substantially similar to that of the second embodiment. When the input terminal $P_i$ is in a state H, both PMOS transistors $Q_1$ and $Q_7$ enter ON states by the inverter G1, to maintain the state H of the input terminal $P_i$. When the input terminal $P_i$ is in a state H, the PMOS transistor $Q_7$ is brought into an OFF state by the inverter G1, and makes no contribution to this input circuit but performs the same operation as that in the second embodiment.

If the PMOS transistor $Q_1$ is brought into an ON state by pulses generated from a pulse generation circuit SG when the input terminal $P_i$ is converted from a state L to a Z state so that the input terminal $P_i$ is converted to a state H, the PMOS transistor $Q_7$ is also immediately brought into an ON state by the inverter G1, to perform the same operation as that in the second embodiment as the result.

The third embodiment has such an additional effect that the input terminal $P_i$ is pulled down with smaller ON resistance as compared with the second embodiment when the PMOS transistors $Q_1$ and $Q_7$ enter ON states and the ON resistance of the transistor Q7 is connected parallel to the ON resistance of the transistor $Q_1$, to be resistant against noise. On the other hand, only the PMOS transistor $Q_1$ is brought into an ON state by the pulses generated from the pulse generation circuit SG when the input terminal $P_i$ is in a state H, and the intermittently flowing unwanted current is not increased similarly to the second embodiment. Thus, it is possible to independently design pullup resistance while suppressing undesired power consumption.

Figure 7:
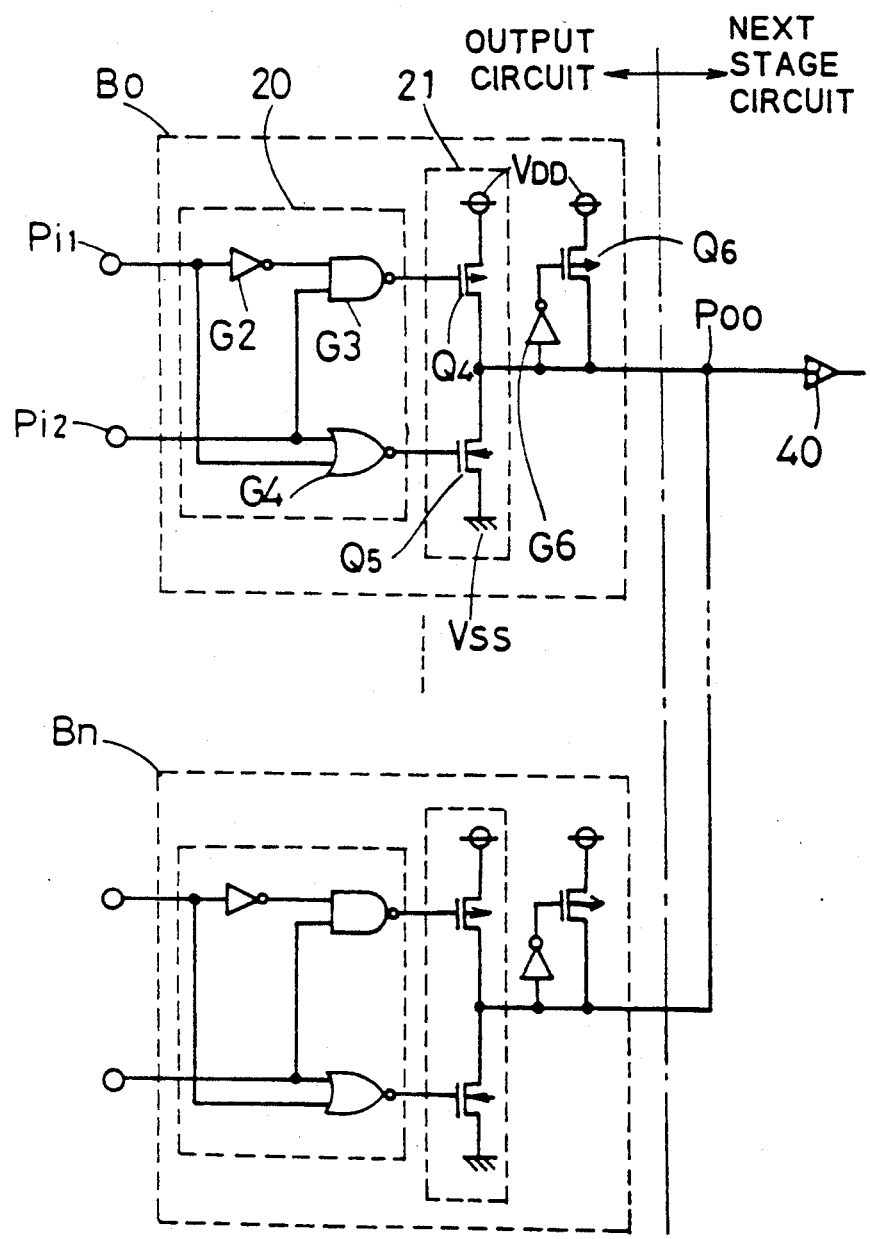
FIG. 7 is a circuit diagram showing a pullup resistance control output circuit according to a fourth embodiment of the present invention.
Figure 15:
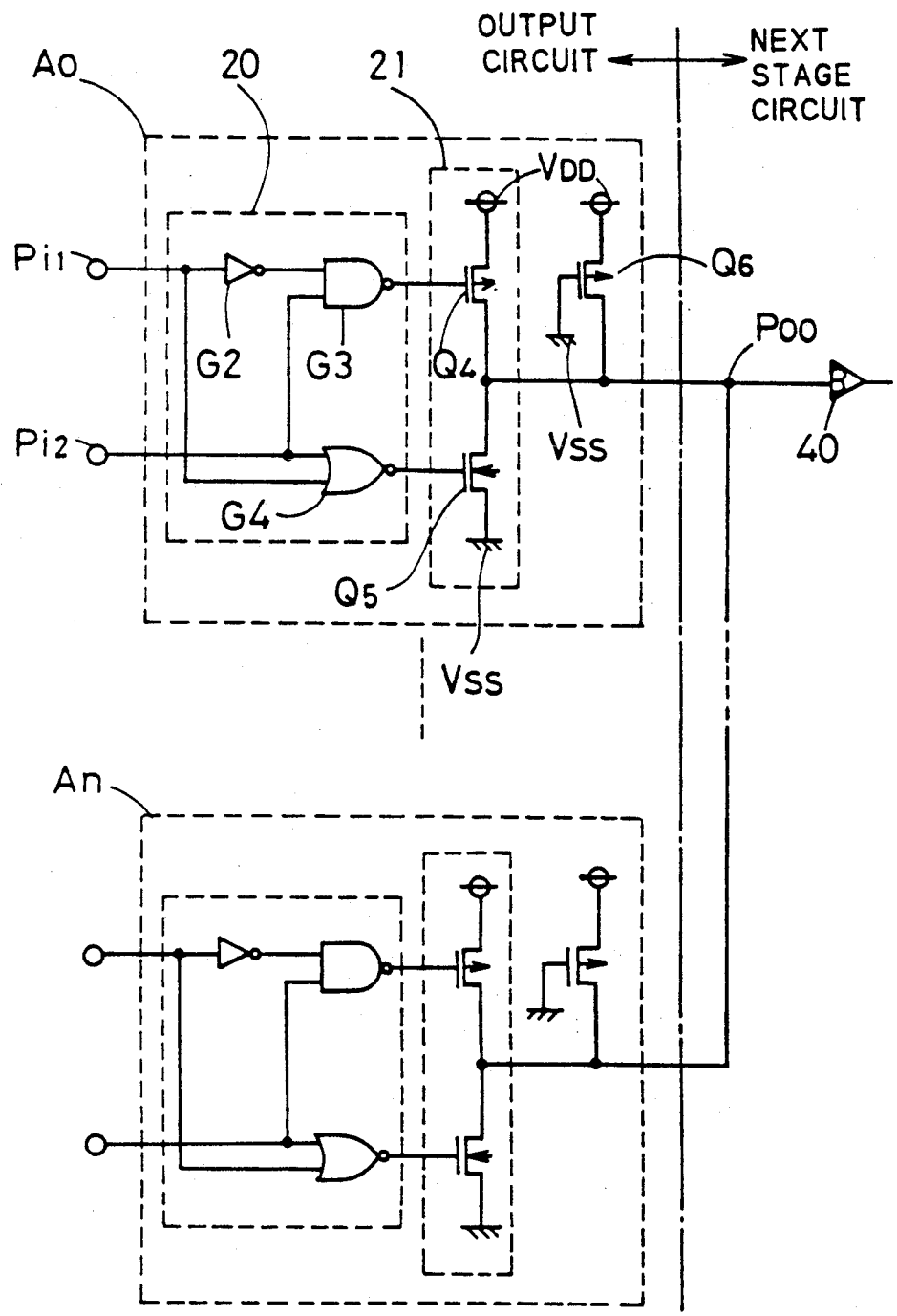
FIG. 15 is a circuit diagram showing a conventional output buffer circuit.

FIG. 7 is a circuit diagram showing a pullup resistance control output circuit according to a fourth embodiment of the present invention. Similarly to the conventional output buffer circuit, a control circuit 20 and an inverter 21 are interconnected with each other, and the respective elements are formed similarly to the conventional case (FIG. 15). Namely, gates G2, G3 and G4 form the tristate type control circuit 20. The gate G2 is an inverter whose input end is connected to a drive allowing input terminal $P_{i1}$. The NAND gate G3 has a first input end which is connected to an output end of the gate G2 and a second input end which is connected to a drive selecting input terminal $P_{i2}$ respectively. The NOR gate G4 has a first input end which is connected to the drive allowing input terminal $P_{i1}$ and a second input end which is connected to the drive selecting input terminal $P_{i2}$ respectively.

A PMOS transistor $Q_4$ has a drain which is connected to an output terminal $P_{OO}$, a source which is connected to a power source $V_{DD}$, and a gate which is connected to an output end of a NAND gate G3, while an NMOS transistor $Q_5$ has a drain which is connected to the output terminal $P_{OO}$, a source which is connected to a power source $V_{SS}$, and a gate which is connected to an output end of the NOR gate G4. Namely, the MOS transistors $Q_4$ and $Q_5$ form the tristate type CMOS inverter 21.

The control circuit 20 controls the inverter 21 in accordance with signals inputted in the drive allowing input terminal $P_{i1}$ and the drive selecting input terminal $P_{i2}$, also similarly to the conventional output buffer circuit.

A PMOS transistor $Q_6$, which is a pullup transistor, also has a drain which is connected to the output terminal $P_{OO}$ and a source which is connected to the power source $V_{DD}$ similarly to the conventional output buffer circuit, while its gate is connected to an output end of an inverter G6. An input end of the inverter G6 is connected to the output terminal $P_{OO}$, and its transition voltage is $V_{RT}$.

The control circuit 20, the inverter 21, the PMOS transistor $Q_6$ and the inverter G6 form an output circuit $B_O$. Further, n output circuits having similar structures are connected in common with the output terminal $P_{OO}$. An input buffer circuit 40 of a next stage circuit is connected to the output terminal $P_{OO}$.

The operation is now described. It is assumed here that a low logical level is inputted only in the drive allowing input terminal $P_{i1}$ of the output circuit $B_O$, to select the output circuit $B_O$. If the drive selecting input terminal $P_{i2}$ is in a state H in this case, the PMOS transistor $Q_4$ enters an ON state and the NMOS transistor $Q_5$ enters an OFF state. Thus, a high logical level is outputted at the output terminal $P_{OO}$ by action of the inverter 21. At this time, the inverter G6 supplies a low logical level to the gate of the PMOS transistor $Q_6$, and the output terminal $P_{OO}$ is pulled up with the ON resistance of the PMOS transistor $Q_6$, similarly to the conventional case. Namely, the potential of the output terminal $P_{OO}$ is maintained at a high logical level. Since the NMOS transistor $Q_5$ is in an OFF state, no current flows to the power source $V_{SS}$ through the PMOS transistor $Q_6$.

When the drive selecting input terminal $P_{i2}$ is in a state L, on the other hand, the PMOS transistor $Q_4$ enters an OFF state and the NMOS transistor $Q_5$ enters an ON state. Thus, a low logical level is outputted at the output terminal $P_{OO}$ by action of the inverter 21. At this time, the inverter G6 supplies a high logical level to the gate of the PMOS transistor $Q_6$, to bring the PMOS transistor $Q_6$ into an OFF state. Therefore, no current flows to the power source $V_{SS}$ through the PMOS transistor $Q_6$ even if the NMOS transistor $Q_5$ is in an ON state, and hence it is possible to avoid undesired power consumption.

Description is now made on such a case that a state in which either a high logical level or a low logical level is outputted with respect to the output terminal $P_{OO}$ (in this state, any one of the output circuits $B_O$ to $B_n$ is selected by a low logical level input in its drive allowing input terminal $P_{i1}$, as a matter of course) is converted to such a state that none of the output circuits $B_O$ to $B_n$ is selected since the drive allowing input terminal $P_{i1}$ enters a high logical level, whereby the PMOS transistor $Q_4$ as well as the NMOS transistor $Q_5$ enter OFF states in each of the output circuits $B_O$ to $B_n$ and the inverter 21 provides the output terminal $P_{OO}$ with a Z state.

When the output terminal $P_{OO}$ is converted from a state H (PMOS transistor $Q_4$, ON; NMOS transistor $Q_5$, OFF) to a Z state, the output of the inverter G6 (potential of the gate of the PMOS transistor $Q_6$) remains at a low logical level and the PMOS transistor $Q_6$ maintains an ON state, whereby the potential of the output terminal $P_{OO}$ is maintained at a high logical level, i.e., the state H, from the power source $V_{DD}$ through the PMOS transistor $Q_6$.

When the output terminal $P_{OO}$ is converted from a state L (PMOS transistor $Q_4$, OFF; NMOS transistor $Q_5$, ON) to a Z state, on the other hand, the output of the inverter G6 remains at a high logical level and hence the PMOS transistor $Q_6$ maintains an OFF state, whereby the potential of the output terminal $P_{OO}$ is maintained at a low logical level, i.e., the state L. At this time, the following effect can be further attained by designing the transition voltage $V_{RT}$ of the inverter G6 to be larger than the transition voltage $V_{IT}$ of the input buffer circuit 40 of the next stage circuit.

When the output terminal $P_{OO}$ is converted from a state L to a Z state since none of the output circuits $B_O$ to $B_n$ is selected, a low logical level is outputted at the output terminal $P_{OO}$, as hereinabove described.

In this case, however, there is no factor for forcibly setting the potential of the output terminal $P_{OO}$, and hence the potential of the output terminal $P_{OO}$ may be raised by leakage of the PMOS transistor $Q_6$, for example. If this state is left intact, the potential of the output terminal $P_{OO}$ finally reaches the transition voltage $V_{IT}$ of the input buffer circuit 40 of the next stage circuit, to feed a large through current to the input buffer circuit 40 if the input buffer circuit 40 has a CMOS structure. Such a trouble can be avoided by designing the transition voltage $V_{RT}$ of the inverter G6 to be smaller than the transition voltage $V_{IT}$. Such avoidance is now described.

When the potential of the output terminal $P_{OO}$ is smaller than the transition voltage $V_{RT}$ of the inverter G6, the same is smaller than the transition voltage $V_{IT}$ of the input buffer circuit 40 of the next stage circuit, and hence the output terminal $P_{OO}$ supplies a low logical level to the next stage circuit.

When the potential of the output terminal $P_{OO}$ exceeds the transition voltage $V_{RT}$ of the inverter G6, however, the output of the inverter G6 goes to a low logical level to bring the PMOS transistor $Q_6$ into an ON state, and the output terminal $P_{OO}$ is inverted to a high logical level through the PMOS transistor $Q_6$.

At this time, the potential of the output terminal $P_{OO}$ will not take a value around the transition voltage of the input buffer circuit 40 of the next stage circuit. This is because the potential of the output terminal $P_{OO}$ immediately reaches a value around the potential $V_{DD}$ beyond the potential $V_{IT}$ when the same starts rising from the potential $V_{RT}$, due to the relation $V_{RT} < V_{IT}$. Thus, it is possible to avoid flow of a through current to the input buffer circuit 40 of the next stage circuit.

When the output terminal $P_{OO}$ is converted from a state H to a Z state, the potential of the output terminal $P_{OO}$ will not fluctuate since the same is defined by the power source $V_{DD}$ through the PMOS transistor $Q_6$.

Figure 8:
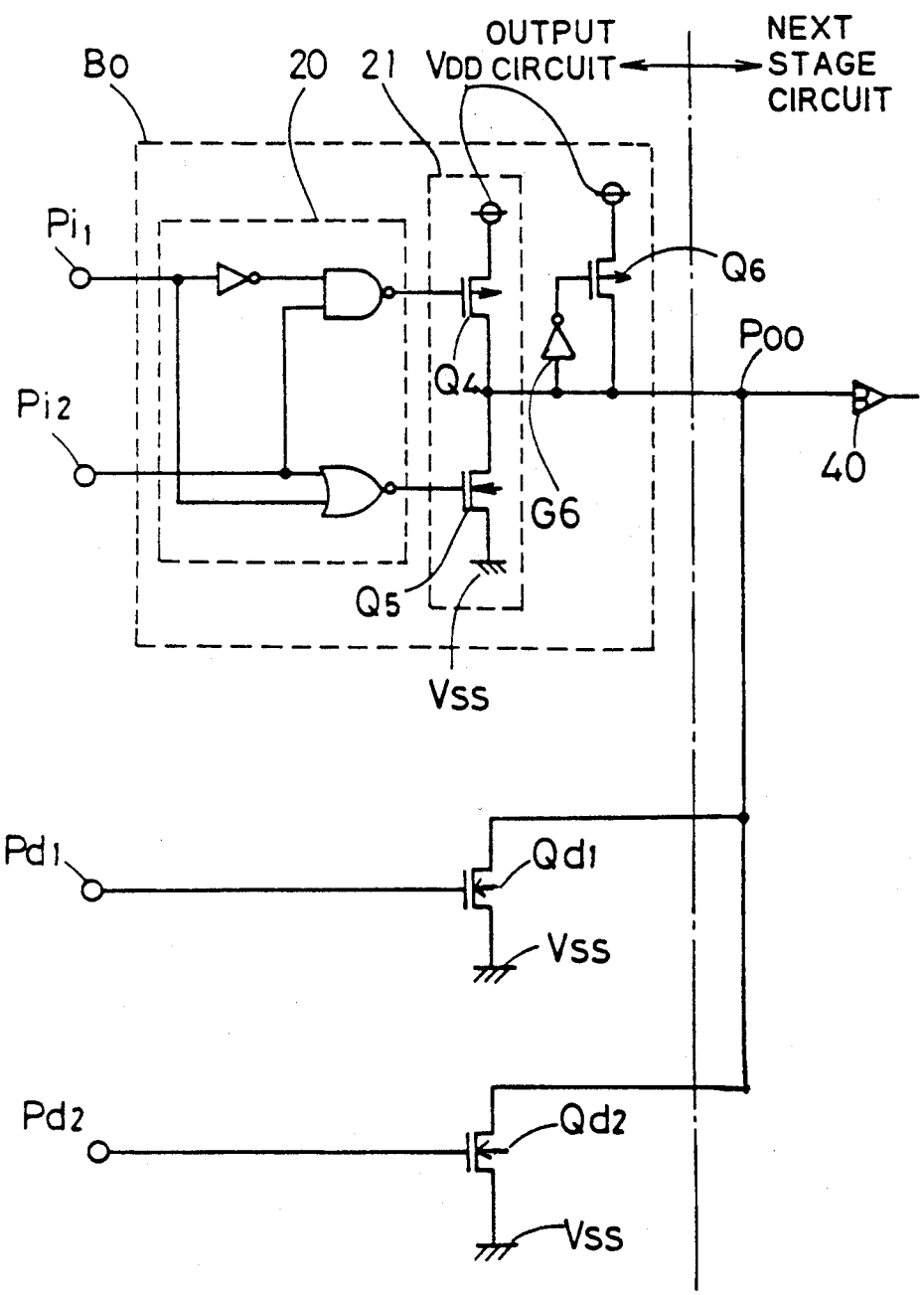
FIG. 8 is a circuit diagram showing a pullup resistance control output circuit according to a fifth embodiment of the present invention.

FIG. 8 is a circuit diagram showing a pullup resistance control output circuit according to a fifth embodiment of the present invention. An output circuit $B_0$ which is formed similarly to that of the fourth embodiment is connected to a drive allowing input terminal $P_{i1}$, a drive selecting terminal $P_{i2}$ and an output terminal $P_{OO}$. On the other hand, drains of pulldown NMOS transistors $Q_{d1}$ and $Q_{d2}$ are commonly connected to the output terminal $P_{OO}$. The pulldown NMOS transistors $Q_{d1}$ and $Q_{d2}$ have sources which are connected to a power source $V_{SS}$ and gates which are connected to drive selecting input terminals $P_{d1}$ and $P_{d2}$ respectively.

The operation is now described. It is assumed here that a low logical level is inputted only in the drive allowing input terminal $P_{i1}$ of the output circuit $B_0$ to select the output circuit $B_0$, while low logical levels are inputted in the drive selecting input terminals $P_{d1}$ and $P_{d2}$ to bring the PMOS transistors $Q_{d1}$ and $Q_{d2}$ into OFF states. If the drive selecting input terminal $P_{i2}$ is in a state H in this case, the PMOS transistor $Q_4$ enters an ON state and the NMOS transistor $Q_5$ enters an OFF state so that a high logical level is outputted at the output terminal $P_{00}$. At this time, the inverter G6 supplies a low logical level to the gate of the PMOS transistor $Q_6$, and the output terminal $P_{00}$ is pulled up with ON resistance of the PMOS transistor $Q_6$, similarly to the conventional case. Namely, the potential of the output terminal $P_{00}$ is maintained at a high logical level. Since the NMOS transistor $Q_5$ is in an OFF state, no current flows to the power source $V_{SS}$ through the PMOS transistor $Q_6$.

When the drive selecting input terminal $P_{i2}$ is in a state L, on the other hand, a low logical level is outputted at the output terminal $P_{00}$. Since the PMOS transistor $Q_6$ enters an OFF state at this time, no current flows to the power source $V_{SS}$ through the PMOS transistor $Q_6$ even if the NMOS transistor $Q_5$ is in an ON state, and hence it is possible to avoid undesired power consumption.

When the drive allowing input terminal $P_{i1}$ is in a state H and the output circuit $B_0$ is not selected while at least one of the drive selecting input terminals $P_{d1}$ and $P_{d2}$ enters a state L and either one of the NMOS transistors $Q_{d1}$ and $Q_{d2}$ enters an ON state, a low potential level is outputted at the output terminal $P_{00}$.

Description is now made on the case where such a state that either a high logical level or a low logical level is outputted with respect to the output terminal $P_{00}$ is converted to a Z state in which the drive allowing input terminal $P_{i1}$ is in a state H, both drive selecting input terminals $P_{d1}$ and $P_{d2}$ are in states L and both PMOS transistors $Q_{d1}$ and $Q_{d2}$ enter OFF states so that no output is generated at the output terminal $P_{00}$.

When the output terminal $P_{00}$ is converted from a state H (PMOS transistor $Q_4$, ON; NMOS transistor $Q_5$: OFF) to the Z state as described above, the output of the inverter G6 remains at a low logical level similarly to the fourth embodiment and the PMOS transistor $Q_6$ maintains an ON state, whereby the potential of the output terminal $P_{00}$ is maintained at a high logical level, i.e., a state H, from the power source $V_{DD}$ through the PMOS transistor $Q_6$.

When the output terminal $P_{00}$ is converted from a state L (PMOS transistor $Q_4$, OFF; NMOS transistor $Q_5$, ON) to the Z state as described above, the output of the inverter G6 remains at a high logical level and hence the PMOS transistor $Q_6$ maintains an OFF state, whereby the potential of the output terminal $P_{00}$ is maintained at a low logical level, i.e., the state L. At this time, the following effect can be further attained by designing the transition voltage $V_{RT}$ of the inverter G6 to be smaller than the transition voltage $V_{IT}$ of the input buffer circuit 40 of the next stage circuit.

When the output terminal $P_{00}$ is thus converted from a state L to the Z state since the output circuit $B_0$ is not selected and the NMOS transistors $Q_{d1}$ and $Q_{d2}$ enter OFF states, a low logical level is outputted at the output terminal $P_{00}$.

In this case, however, there is no factor for forcibly setting the potential of the output terminal $P_{00}$, and hence the potential of the output terminal $P_{00}$ may be raised by leakage of the PMOS transistor $Q_6$, for example. If this state is left intact, the potential of the output terminal $P_{00}$ finally reaches the transition voltage $V_{IT}$ of the input buffer circuit 40 of the next stage circuit, to feed a large through current to the input buffer circuit 40 if the input buffer circuit 40 has a CMOS structure. Such a trouble can be avoided by designing the transition voltage $V_{RT}$ of the inverter G6 to be smaller than the transition voltage $V_{IT}$. Such avoidance is now described.

When the potential of the output terminal $P_{00}$ is smaller than the transition voltage $V_{RT}$ of the inverter G6, the same is smaller than the transition voltage $V_{IT}$ of the input buffer circuit 40 of the next stage circuit, and hence the output terminal $P_{00}$ supplies a low logical level to the next stage circuit.

When the potential of the output terminal $P_{00}$ exceeds the transition voltage $V_{RT}$ of the inverter G6, however, the output of the inverter G6 goes to a low logical level to bring the PMOS transistor $Q_6$ into an ON state, and the output terminal $P_{00}$ is inverted to a high logical level through the PMOS transistor $Q_6$.

At this time, the potential of the output terminal $P_{00}$ will not take a value around the transition voltage of the input buffer circuit 40 of the next stage circuit. This is because the potential of the output terminal $P_{00}$ immediately reaches a value around the potential $V_{DD}$ beyond the potential $V_{IT}$ when the same starts rising from the potential $V_{RT}$, due to the relation $V_{RT} < V_{IT}$. Thus, it is possible to avoid flow of a through current to the input buffer circuit 40 of the next stage circuit.

When the output terminal $P_{00}$ is converted from a state H to a Z state, the potential of the output terminal $P_{00}$ will not fluctuate since the same is defined by the power source $V_{DD}$ through the PMOS transistor $Q_6$.

Figure 9:
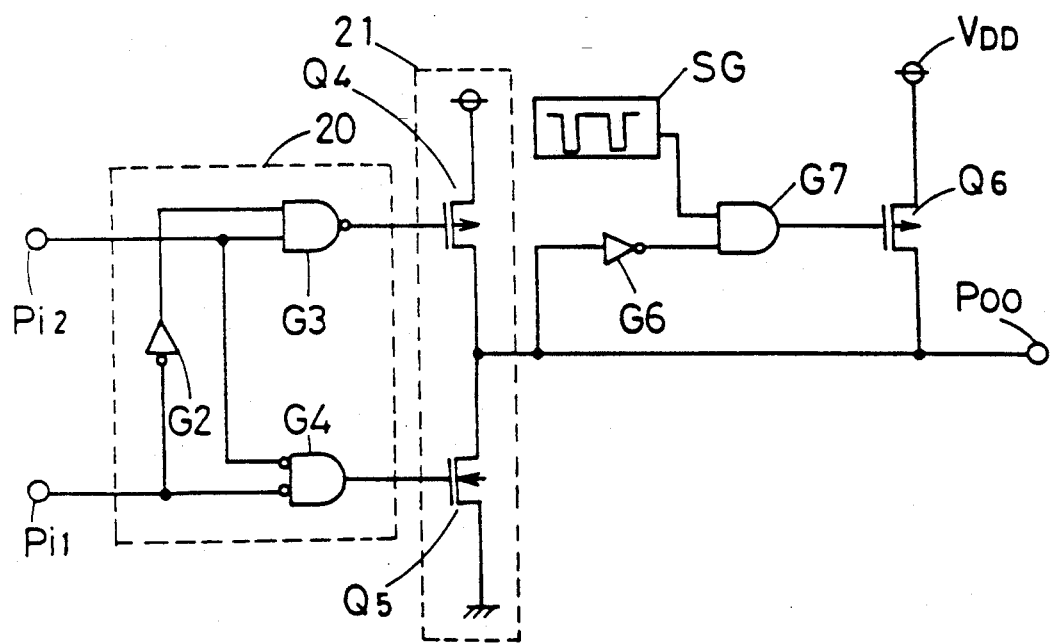
FIG. 9 is a circuit diagram showing a pullup resistance control output circuit according to a sixth embodiment of the present invention.

FIG. 9 is a circuit diagram showing a pullup resistance control output circuit according to a sixth embodiment of the present invention. For the purpose of simplification, only a portion corresponding to the output circuit $B_0$ of the fourth or fifth embodiment is shown in this figure. A control circuit 20 is connected to a drive allowing input terminal $P_{i1}$ and a drive selecting input terminal $P_{i2}$. The control circuit 20 is interconnected with an inverter 21. Such connection is similar to the conventional case (FIG. 15) and the fourth and fifth embodiments (FIGS. 7 and 8).

A PMOS transistor $Q_6$, which is a pullup transistor, has a drain which is connected to an output terminal $P_{00}$ and a source which is connected to a power source $V_{DD}$ similarly to the fourth and fifth embodiments, while its gate is connected to an output end of an AND gate G7. The AND gate G7 has a first input end which is connected to an output end of an inverter G6 and a second input end which is connected to a pulse generation circuit SG. An input end of the inverter G6 is connected to the output terminal $P_{00}$.

Namely, the connection relation between the AND gate G7, the inverter G6, the pulse generation circuit SG and the PMOS transistor $Q_6$ in the sixth embodiment is similar to the connection relation between the OR gate G5, the inverter G1, the pulse generation circuit SG and the PMOS transistor $Q_1$ in the second embodiment which is related to a pullup resistance control input circuit. Therefore, the action of the pulse generation circuit SG in the sixth embodiment is also similar to that in the second embodiment. The operation of the overall circuit is now described with reference to a timing chart shown in FIG. 11.

When the drive allowing input terminal $P_{i1}$ is in a state L ($t < t_2$), this output circuit enters an output state, to transmit a potential which is supplied to the drive selecting input terminal $P_{i2}$ to the output terminal $P_{00}$. Namely, when the state of the drive selecting input terminal $P_{i2}$ is inverted at a time $t_1$, the state of the output terminal $P_{00}$ follows this. When the drive allowing input terminal $P_{i1}$ enters a state H ($t_2 < t < t_3$), a NOR gate G4 outputs a low logical level and a NAND gate G3 outputs a high logical level respectively, and both a PMOS transistor $Q_4$ and an NMOS transistor $Q_5$ enter OFF states. Namely, the potential outputted at the output terminal $P_{00}$ is determined by this output circuit when the drive allowing input terminal $P_{i1}$ is in a state L, while the same is determined by a state of a next stage circuit which is connected to the output terminal $P_{00}$ when the terminal $P_{i1}$ is in a state H.

Figure 11:
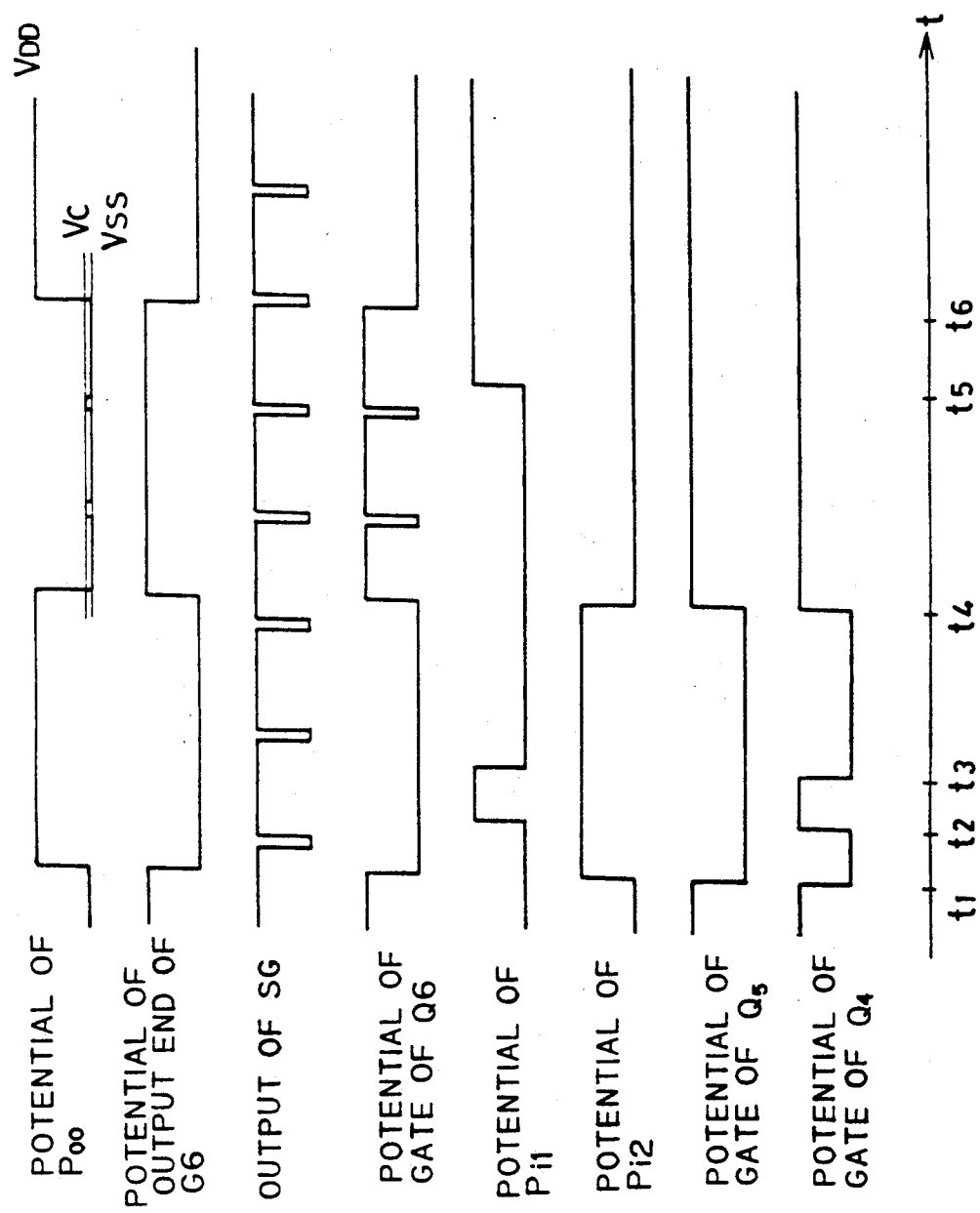
FIG. 11 is a timing chart showing the operation of the pullup resistance control output circuit shown in FIG. 9.

Regardless of the state of the drive allowing input terminal $P_{i1}$, the output end of the inverter G6 enters a state L and the gate of the PMOS transistor $Q_6$ also enters a state L when the output terminal $P_{00}$ is in a state H ($t_1 < t < t_3$). Thus, the PMOS transistor $Q_6$ enters an ON state. Even if the drive allowing input terminal $P_{i1}$ thereafter enters a state L, the output terminal $P_{00}$ is pulled up by the PMOS transistor $Q_6$ and this state is maintained since the inverter G6 and the NOR gate G7 maintain the PMOS transistor $Q_6$ in an ON state ($t_3 < t < t_4$). This operation is similar to those of the fourth and fifth embodiments. When the output terminal $P_{00}$ is in a state L, the output end of the inverter G6 enters a state H, and the output of the pulse generation circuit SG is transmitted to the gate of the PMOS transistor $Q_6$ ($t_4 < t < t_6$). At this time, the PMOS transistor $Q_6$ intermittently enters an ON state in accordance with pulses generated by the pulse generation circuit SG. Therefore, the potential of the output terminal $P_{00}$ becomes a level which is determined by resistance division of ON resistance of the PMOS transistor $Q_4$ and that of the PMOS transistor $Q_6$. Referring to FIG. 11, the intermittent potential rise caused by the output of the pulse generation circuit SG indicates this ($t_4 < t < t_5$).

Even if the inverter 21 enters a Z state when the drive allowing input terminal $P_{i1}$ enters a state H at a time $t_5$, i.e., when the drive selecting input terminal $P_{i2}$ is in a state L ($t = t_5$), the PMOS transistor $Q_6$ remains in an OFF state and the output terminal $P_{00}$ remains in a state L until a time $t_6$. This also applies to such a case that the drive allowing input terminal $P_{i1}$ remains in a state H and the output terminal $P_{00}$ enters a Z state by action of the next stage circuit. When the pulse generation circuit SG outputs a low logical level pulse at the time $t_6$, the potential of the output terminal $P_{00}$ is raised to reach a high logical level since the output terminal $P_{00}$ has already entered the Z state at the time $t_5$. Thus, the PMOS transistor $Q_6$ maintains an ON state.

Namely, according to the sixth embodiment, it is possible to quickly convert the potential of the output terminal $P_{00}$ to a high logical level even if the drive allowing input terminal $P_{i1}$ enters a state H and the inverter 21 enters a Z state. That is, it is possible to avoid such a conceivable case that the potential of the output terminal $P_{00}$ being in a Z state is raised by leakage or the like to approach the transition voltage $V_{IT}$ of the input buffer circuit 40 of the next stage circuit to feed a large through current to the next stage circuit.

The pulses generated by the pulse generation circuit intermittently feed an unwanted current to the PMOS transistor $Q_6$ when the output terminal $P_{00}$ is in a state L. However, these pulses may be narrow as understood from the above operation, and it is possible to suppress undesired power consumption in the PMOS transistor $Q_6$.

Figure 10:
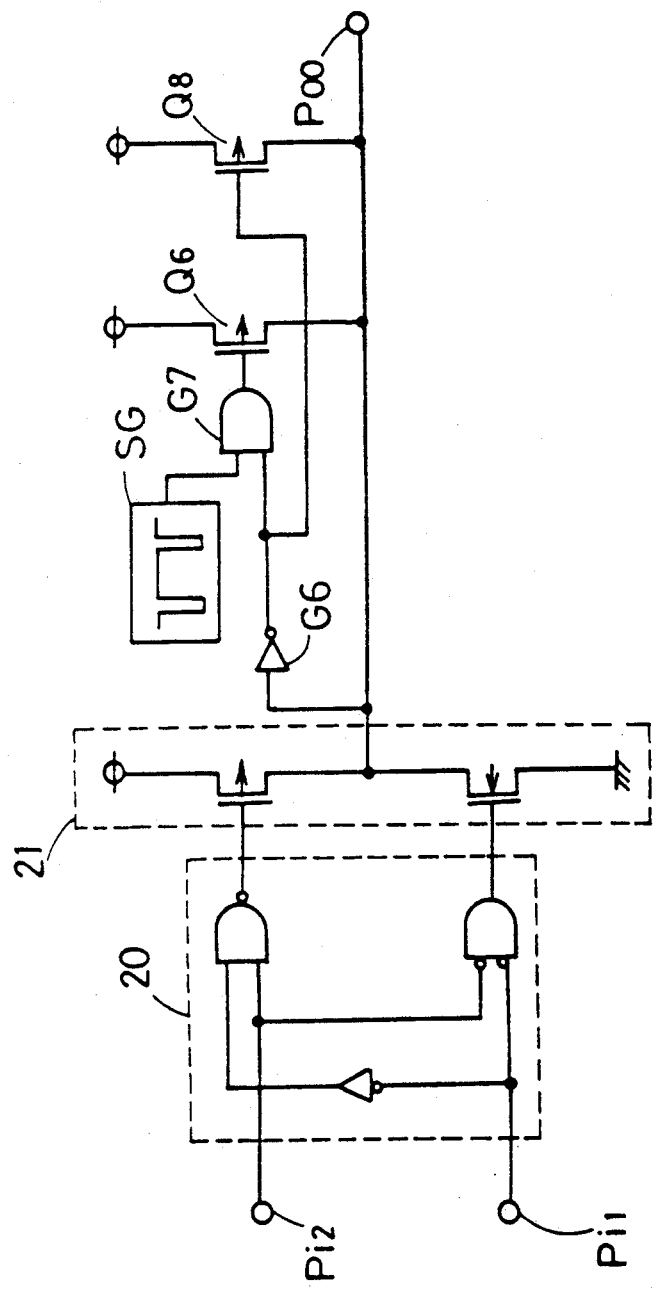
FIG. 10 is a circuit diagram showing a pullup resistance control output circuit according to a seventh embodiment of the present invention.

FIG. 10 is a circuit diagram showing a pullup resistance control output circuit according to a seventh embodiment of the present invention. A PMOS transistor $Q_8$ is further added to the sixth embodiment shown in FIG. 9 as a pullup transistor. The PMOS transistor $Q_8$ has a drain which is connected to an output terminal $P_{00}$, a source which is connected to a power source $V_{DD}$, and a gate which is connected to an output end of an inverter G1.

The operation of the output circuit having the aforementioned structure is substantially similar to that of the sixth embodiment. When the output terminal $P_{00}$ is in a state H, both PMOS transistors $Q_6$ and $Q_8$ enter ON states by an inverter G6, to maintain the output terminal $P_{00}$ in the state H. When the output terminal $P_{00}$ is in a state L, on the other hand, the PMOS transistor $Q_8$ is brought into an OFF state by the inverter G6 and makes no contribution to the operation of this output circuit but performs the same operation as that in the sixth embodiment.

When the output terminal $P_{00}$ is converted from a state L to a Z state and the PMOS transistor $Q_6$ enters an ON state by pulses generated by a pulse generation circuit SG so that the output terminal $P_{00}$ is converted to a state H, the PMOS transistor $Q_8$ is immediately brought into an ON state by the inverter G6, to perform the same operation as that in the sixth embodiment as the result.

The seventh embodiment has such an additional effect that the output terminal $P_{00}$ is pulled up with smaller ON resistance as compared with that in the sixth embodiment when the PMOS transistors $Q_6$ and $Q_8$ enter ON states, to be resistant against noise. On the other hand, only the PMOS transistor $Q_6$ is brought into an ON state by the pulses generated from the pulse generation circuit SG when the output terminal $P_{00}$ is in a state L, and an intermittently flowing unwanted current is not increased similarly to the sixth embodiment. Thus, it is possible to independently design pullup resistance while suppressing undesired power consumption.

While the invention has been shown and described in detail, the foregoing description is in all aspects illustrative and not restrictive. It is therefore understood that numerous modifications and variations can be devised without departing from the scope of the invention.

We claim:

1. A pullup resistance control input circuit, comprising:

an input terminal;

an output terminal;

an input buffer circuit provided between high and low potential points, having an input end connected to said input terminal and an output end connected to said output terminal, and having a first transition voltage;

a first transistor having a first electrode being connected to said input terminal, a second electrode being connected to said high potential point end a control electrode, said first transistor being driven to an ON state when said control electrode has a relatively low potential while being driven to an OFF state when said control electrode has a relatively high potential; and a first logic inversion circuit having an input end being connected to said input terminal and an output end being connected to said control electrode of said first transistor, for outputting said relatively low potential to said control electrode of said first transistor when said input terminal has a potential higher than a second transition voltage while outputting intermittent pulses reaching said relatively low potential on the basis of said relatively high potential to said control electrode of said first transistor when said input terminal has a potential lower than said second transition voltage.

2. A pulldown resistance control input circuit in accordance with claim 1, wherein said input buffer circuit further comprises:

a second transistor having a first electrode being connected to said output end of said input buffer circuit, a second electrode being connected to said high potential point and a control electrode being connected to said input end of said input buffer circuit, said second transistor being driven to an ON state when said input end of said input buffer circuit has a potential lower than said first transition voltage, and a third transistor having a first electrode being connected to said output end of said input buffer circuit, a second electrode being connected to said low potential point and a control electrode being connected to said input end of said input buffer circuit, said third transistor being driven to an ON state when said input end of said input buffer circuit has a potential higher than said first transition voltage.

3. A pullup resistance control input circuit in accordance with claim 1, wherein said second transition voltage is lower than said first transition voltage.

4. A pullup resistance control input circuit in accordance with claim 1, wherein said first logic inversion circuit comprises:

a pulse generation circuit outputting said intermittent pulses, an inverter having an input end being connected to said input end of said first logic inversion circuit and an output end, and an AND gate having a first input end being connected to said output end of said inverter, a second input end being connected to said pulse generation circuit and an output end being connected to said end of said first logic inversion circuit.

5. A pullup resistance control input circuit in accordance with claim 1, further comprising:

a fourth transistor of the same polarity as said first transistor, having a first electrode being connected to said input terminal, a second electrode being connected to said high potential point and a control electrode; and a second logic inversion circuit having an input end being connected to said input terminal and an output end being connected to said control electrode of said fourth transistor, for outputting said relatively low potential to said control electrode of said fourth transistor when said input terminal has a potential higher than said second transition voltage while outputting said relatively high potential to said control electrode of said fourth transistor when said input terminal has a potential lower than said second transition voltage.

6. A pullup resistance control input circuit in accordance with claim 5, wherein said first logic inversion circuit further comprises a pulse generation circuit outputting said intermittent pulses.

7. A pullup resistance control input circuit in accordance with claim 6, wherein said first logic inversion circuit further comprises an inverter.

8. A pullup resistance control input circuit in accordance with claim 7, wherein said second logic inversion circuit also serves as an inverter provided in said logic inversion circuit.

9. A pulldown resistance control output circuit comprising:

a tristate control circuit having a drive allowing input terminal, a drive selecting input terminal and first and second drive output ends being controlled by signals from said drive allowing input terminal and said drive selecting input terminal;

an output terminal;

an output buffer circuit provided between high and low potential points, having a first input end connected to said first drive output end, a second input end connected to said second drive output end and an output end connected to said output terminal, and having a first transition voltage;

a first transistor having a first electrode being connected to said output terminal, a second electrode being connected to said high potential point and a control electrode, said first transistor being driven to an ON state when said control electrode has a relatively low potential while being driven to an OFF state when said control electrode has a relatively high potential; and a first logic inversion circuit having an input end being connected to said output terminal and an output end being connected to said control electrode of said first transistor;

wherein said first logic inversion circuit has a second transition voltage, said relatively low potential is outputted at said output end of said first logic inversion circuit when said input end of said first logic inversion circuit has a potential higher than said second transition voltage, end said relatively high potential is outputted at said output end of said first logic inversion circuit when said input end of said first logic inversion circuit has a potential lower than said second transition voltage, and wherein said second transition voltage is lower than a transition voltage of a load logic circuit being connected to said output terminal.

10. A pullup resistance control output circuit in accordance with claim 9, wherein said first logic inversion circuit includes an inverter.

11. A pulldown resistance control output circuit comprising:

a tristate control circuit having a drive allowing input terminal, a drive selecting input terminal and first and second drive output ends being controlled by signals from said drive allowing input terminal and said drive selecting input terminal;

an output terminal;

an output buffer circuit provided between high and low potential points, having a first input end connected to said first drive output end, a second input end connected to said second drive output end and an output end connected to said output terminal, and having a first transition voltage;

a first transistor having a first electrode being connected to said output terminal, a second electrode being connected to said high potential point and a control electrode, said first transistor being driven to an ON state when said control electrode has a relatively low potential while being driven to an OFF state when said control electrode has a relatively high potential; and a first logic inversion circuit having an input end being connected to said output terminal and an output end being connected to said control electrode of said first transistor;

wherein said first logic inversion circuit has a second transition voltage, said relatively low potential is outputted at said output end of said first logic inversion circuit when said input end of said first logic inversion circuit has a potential higher than said second transition voltage, and intermittent pulses reaching said relatively low potential on the basis of said relatively high potential are outputted at said output end of said first logic inversion circuit when said input end of said first logic inversion circuit has a potential lower than said second transition voltage.

12. A pullup resistance control output circuit in accordance with claim 11, wherein said second transition voltage is lower than a transition voltage of a load logic circuit being connected to said output terminal.

13. A pullup resistance control output circuit in accordance with claim 11, wherein said first logic inversion circuit comprises:

a pulse generation circuit outputting said intermittent pulses;

an inverter having an input end being connected to said input end of said first logic inversion circuit and an output end, an AND gate having a first input end being connected to an output end of said inverter, a second input end being connected to said pulse generation circuit and an output end being connected to said output end of said first logic inversion circuit.

14. A pullup resistance control output circuit in accordance with claim 11, further comprising:

a fourth transistor of the same polarity as said first transistor having a first electrode being connected to said output terminal, a second electrode being connected to said low potential point and a control electrode, and a second logic inversion circuit having an input end being connected to said output terminal and an output end being connected to said control electrode of said fourth transistor for outputting said relatively low potential to said control electrode of said fourth transistor when said output terminal has a potential higher than said second transition voltage while outputting said relatively high potential to said control electrode of said fourth transistor when said input terminal has a potential lower than said second transition voltage.

15. A pullup resistance control output circuit in accordance with claim 14, wherein said first logic inversion circuit further comprises a pulse generation circuit outputting said intermittent pulses.

16. A pullup resistance control output circuit in accordance with claim 15, wherein said first logic inversion circuit further comprises an inverter.

17. A pullup resistance control output circuit in accordance with claim 16, wherein said second logic inversion circuit also serves as an inverter provided in said first logic inversion circuit.

18. A pulldown resistance control input circuit, comprising:

an input terminal;

an output terminal;

an input buffer circuit provided between high and low potential points, having an input end connected to said input terminal and an output end connected to said output terminal, and having a first transition voltage;

a first transistor having a first electrode being connected to said input terminal, a second electrode being connected to said high potential point and a control electrode, said first transistor being driven to an ON state when said control electrode has a relatively low potential while being driven to an OFF state when said control electrode has a relatively high potential; and a logic inversion circuit having an input end being connected to said input terminal and an output end being connected to said control electrode of said first transistor, and having a second transition voltage lower than the first transition voltage, wherein said relatively low potential is outputted at said output end of said logic inversion circuit when said input end of said logic inversion circuit has a potential higher than said second transition voltage, and said relatively high potential is outputted at said output end of said logic inversion circuit when said input end of said logic inversion circuit has a potential lower than said second transition voltage; and wherein said input buffer circuit further comprises:

a second transistor having a first electrode being connected to said output end of said input buffer circuit, a second electrode being connected to said high potential point and a control electrode being connected to said input end of said input buffer circuit, said second transistor being driven to an ON state when said input end of said input buffer circuit has a potential lower than said first transition voltage, and a third transistor having a first electrode being connected to said output end of said input buffer circuit, a second electrode being connected to said low potential point and a control electrode being connected to said input end of said input buffer circuit, said third transistor being driven to an ON state when said input end of said input buffer circuit has a potential higher than said first transition voltage.

19. A pulldown resistance control input circuit in accordance with claim 18, wherein said logic inversion circuit includes an inverter.

* * * * *